US012787464B2

(12) United States Patent
Noh

(10) Patent No.: US 12,787,464 B2
(45) **Date of Patent: *Nov. 3, 2026**

(54) IMAGE SENSOR WITH REDUCED LEAKAGE CURRENT

(71) Applicant: SAMSUNG ELECTRONICS CO., LTD., Suwon-si (KR)

(72) Inventor: Hyunpil Noh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

This patent is subject to a terminal disclaimer.

(21) Appl. No.: 18/486,926

(22) Filed: Oct. 13, 2023

(65) Prior Publication Data

US 2024/0038794 A1 Feb. 1, 2024

Related U.S. Application Data

(63) Continuation-in-part of application No. 17/969,343, filed on Oct. 19, 2022, now Pat. No. 12,520,609.

(30) Foreign Application Priority Data

Oct. 20, 2021 (KR) ........................ 10-2021-0140489

(51) Int. Cl.
*H10F 39/00* (2025.01)
*H10F 39/18* (2025.01)

(52) U.S. Cl.
CPC ..... *H10F 39/80373* (2025.01); *H10F 39/014* (2025.01); *H10F 39/182* (2025.01); *H10F 39/8053* (2025.01); *H10F 39/807* (2025.01)

(58) Field of Classification Search
CPC ............. H10F 39/80373; H10F 39/014; H10F 39/182; H10F 39/8053; H10F 39/807
See application file for complete search history.

(56) References Cited

U.S. PATENT DOCUMENTS 7,485,939 B2 2/2009 Tanaka et al.
8,093,089 B2 1/2012 Noh
(Continued)

FOREIGN PATENT DOCUMENTS

JP 2016-119411 6/2016
KR 10-2006-0119600 11/2006
(Continued)

OTHER PUBLICATIONS

Office Action in Korean Appln. No. 10-2021-0140489, mailed on Jul. 9, 2025, 12 pages (with Machine translation).

*Primary Examiner* — Norman D Richards
*Assistant Examiner* — Sammantha K Salaz
(74) *Attorney, Agent, or Firm* — FISH & RICHARDSON P.C.

(57) ABSTRACT

An image sensor may include; a semiconductor substrate including a first surface and a second surface, and further including a photoelectric conversion region, a buried gate structure disposed in a buried gate trench extending into the semiconductor substrate from the first surface of the semiconductor substrate, a floating diffusion region disposed on one side of the buried gate structure in the semiconductor substrate, a contact pad disposed on the first surface of the semiconductor substrate above the floating diffusion region and including polysilicon, an intermediate layer disposed on the contact pad and including a metal silicide, and a contact disposed on the intermediate layer and extending in a vertical direction perpendicular to the first surface of the semiconductor substrate.

19 Claims, 46 Drawing Sheets

(56) References Cited

U.S. PATENT DOCUMENTS

| | | | | |
|---|---|---|---|---|
| 8,704,927 | B2 | 4/2014 | Mabuchi | |
| 9,024,361 | B2 | 5/2015 | Ohri et al. | |
| 9,123,834 | B2 | 9/2015 | Fujii | |
| 9,704,909 | B2 | 7/2017 | Kaneda | |
| 10,283,558 | B1 | 5/2019 | Manabe et al. | |
| 10,468,460 | B2 | 11/2019 | Ishii et al. | |
| 12,520,609 | B2 * | 1/2026 | Noh | H10F 39/8027 |
| 2005/0218476 | A1 * | 10/2005 | Lee | H10W 20/494<br>257/E23.15 |
| 2011/0147889 | A1 * | 6/2011 | Tsuchiya | H10B 12/053<br>257/E29.345 |
| 2016/0043118 | A1 | 2/2016 | Yamaguchi | |
| 2018/0301509 | A1 * | 10/2018 | Ishii | H04N 25/78 |
| 2021/0313448 | A1 * | 10/2021 | Wang | H10D 30/0215 |
| 2022/0050506 | A1 * | 2/2022 | Gehlen | G06F 1/1656 |

FOREIGN PATENT DOCUMENTS

| | | | |
|---|---|---|---|
| KR | 10-0875157 | | 12/2008 |
| KR | 10-2009-0071218 | A | 7/2009 |
| KR | 10-1653841 | B1 | 9/2016 |
| KR | 10-2018-0115391 | A | 10/2018 |

* cited by examiner

A1-A1'

A1-A1'

IMAGE SENSOR WITH REDUCED LEAKAGE CURRENT

CROSS-REFERENCE TO RELATED APPLICATION

This application is a continuation-in-part of U.S. patent application Ser. No. 17/969,343, filed on Oct. 19, 2022, which claims priority under 35 U.S.C. § 119 to Korean Patent Application No. 10-2021-0140489 filed on Oct. 20, 2021 in the Korean Intellectual Property Office. Each of these applications is hereby incorporated by reference in its entirety.

BACKGROUND

The inventive concept relates generally to image sensors, and more particularly to image sensors including a photodiode.

An image sensor is a device capable of converting incident electromagnetic energy, e.g., visible light, into a corresponding electrical signal. An image sensor may include a number of pixels, where each pixel may include a photodiode region receiving incident light and converting the incident light into a corresponding electrical signal. That is, the electrical signal may be generated using electrical charge generated in the photodiode region.

It is desirable in many contemporary and emerging applications to reduce the overall size of image sensors, e.g., increase the integration density of image sensors. Accordingly, the unit size of pixels, as well as constituent elements and components within each pixel must be reduced. Unfortunately, however, reductions in the size of pixels and corresponding reductions in the size of constituent pixel elements and components result in increased leakage current.

SUMMARY

Embodiments of the inventive concept provide image sensors exhibiting reduced leakage current. For example, in general, heat treatment processes following an ion implantation process during manufacture of an image sensor can generate a leakage current caused by outward migration or diffusion of impurities from a floating diffusion region within the image sensor. A barrier impurity region including an impurity surrounding the floating diffusion region can suppress the leakage current, as the impurity includes atoms that serve as gettering atoms to suppress or prevent impurity atoms included in the floating diffusion region from diffusing outwardly.

Further, disposing a contact pad and an intermediate layer on a contact within the image sensor increases a physical distance between a buried gate structure and the floating diffusion region and decreases a contact resistance. Increasing the physical distance between the buried gate structure and the floating diffusion region can reduce the likelihood of impurity atoms associated with the floating diffusion migrating or diffusing into a semiconductor substrate of the image sensor. Decreasing the contact resistance can prevent undesired voltage drops within the image sensor.

According to an aspect of the inventive concept, an image sensor may include; a semiconductor substrate including a first surface and a second surface, and further including a photoelectric conversion region; a buried gate structure disposed in a buried gate trench extending into the semiconductor substrate from the first surface of the semiconductor substrate; a floating diffusion region disposed on one side of the buried gate structure in the semiconductor substrate; a contact pad disposed on the first surface of the semiconductor substrate above the floating diffusion region and including polysilicon; an intermediate layer disposed on the contact pad and including a metal silicide; and a contact disposed on the intermediate layer and extending in a vertical direction perpendicular to the first surface of the semiconductor substrate.

According to an aspect of the inventive concept, an image sensor may include; a semiconductor substrate including a first surface and a second surface, and further including a photoelectric conversion region; a buried gate structure disposed in a buried gate trench and extending into the semiconductor substrate from the first surface of the semiconductor substrate; a floating diffusion region including a first type of impurity and disposed on one side of the buried gate structure in the semiconductor substrate; a contact pad disposed on the first surface of the semiconductor substrate above the floating diffusion region; an intermediate layer disposed on the contact pad and including a metal silicide; a contact disposed on the intermediate layer and extending in a vertical direction perpendicular to the first surface of the semiconductor substrate; and a contact barrier region including a second type of impurity, different from the first type of impurity, and disposed under the contact pad and between the contact and the floating diffusion region.

According to an aspect of the inventive concept, an image sensor may include; a semiconductor substrate including a first surface and a second surface, and further including a photoelectric conversion region; a pixel separation structure disposed in a pixel trench passing through the semiconductor substrate to define multiple pixels; a buried gate structure disposed in a buried gate trench extending into the semiconductor substrate from the first surface of the semiconductor substrate; a floating diffusion region including a first type of impurity and disposed on one side of the buried gate structure in the semiconductor substrate; a low-doping region including the first type of impurity and disposed between the floating diffusion region and the buried gate structure and disposed around the floating diffusion region in the semiconductor substrate; an etch stop layer disposed on the first surface of the semiconductor substrate and covering the buried gate structure; a contact pad disposed to vertically overlap the floating diffusion region on the first surface of the semiconductor substrate and including a side wall surrounded by the etch stop layer; an intermediate layer disposed on the contact pad and including a metal silicide; a contact disposed on the intermediate layer and extending in a vertical direction perpendicular to the first surface of the semiconductor substrate; and an interlayer insulating film disposed on the etch stop layer and surrounding the contact.

BRIEF DESCRIPTION OF THE DRAWINGS

Certain advantages, benefits, features and related aspects of the inventive concept, as well as the making and use of the inventive concept may be more clearly understood upon consideration of the following detailed description together with the accompanying drawings.

DETAILED DESCRIPTION

Throughout the written description and drawings, like reference numbers and labels are used to denote like or similar elements, components, method steps, manufacturing processes and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
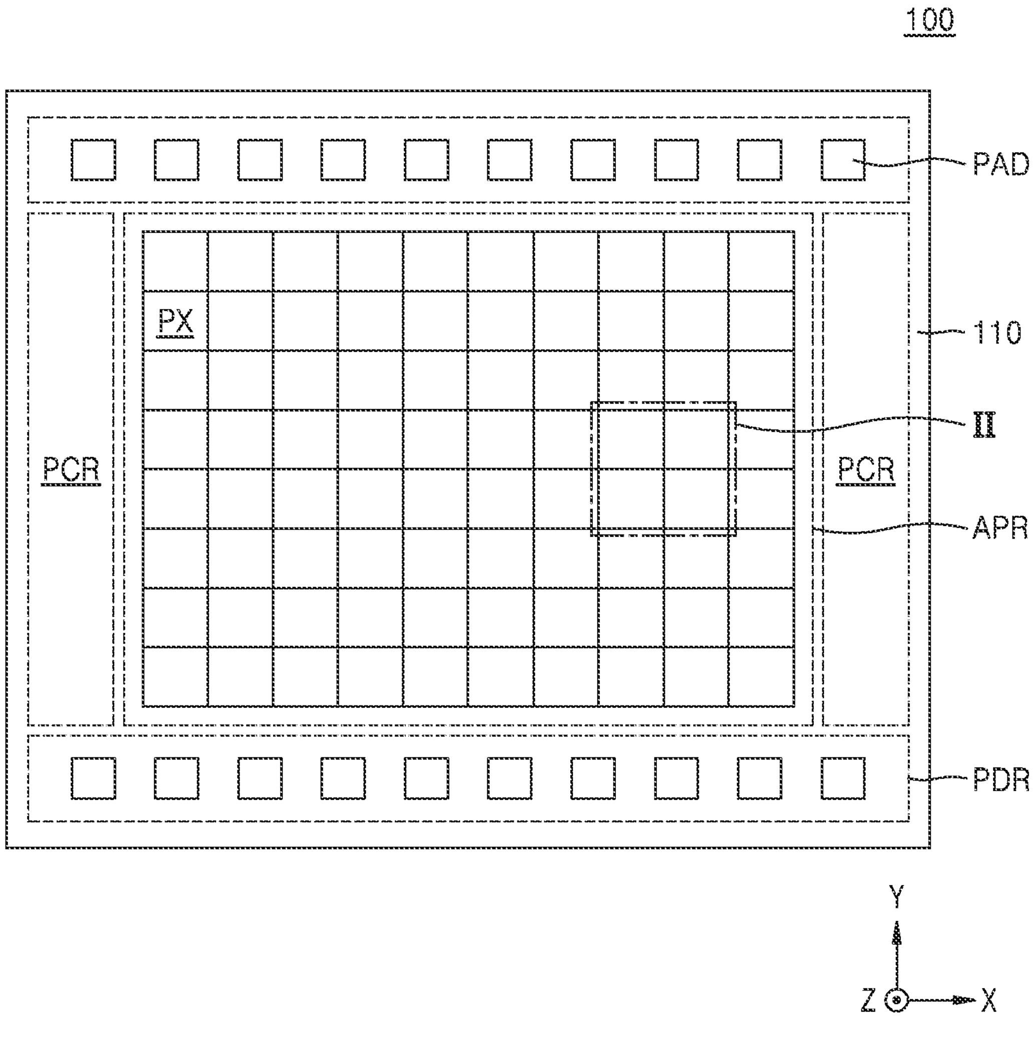
FIG. 1 is an example of a plan, e.g., a top-down or a layout, view illustrating an image sensor.
Figure 2:
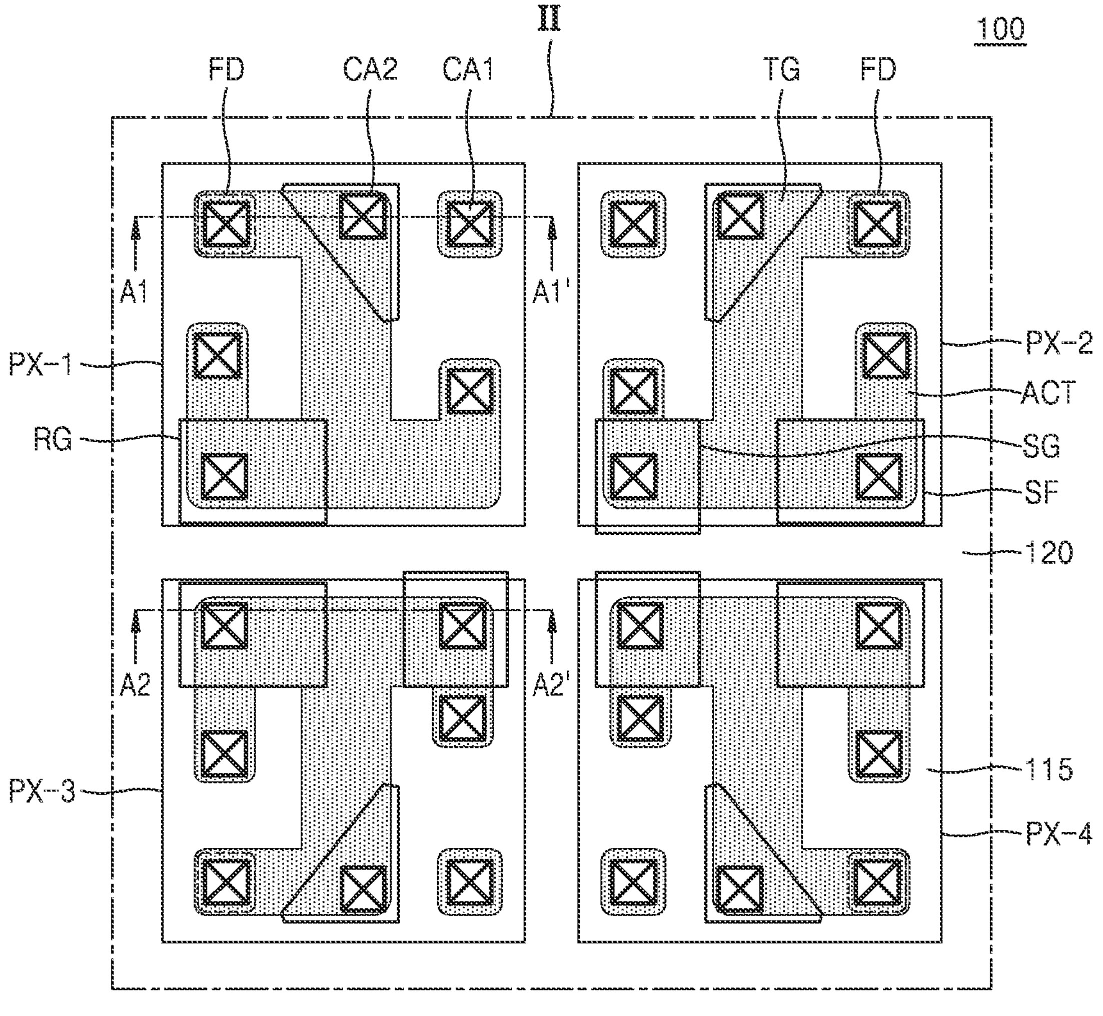
FIG. 2 is an enlarged view of region ‘II’ indicated in FIG. 1.
Figure 3:
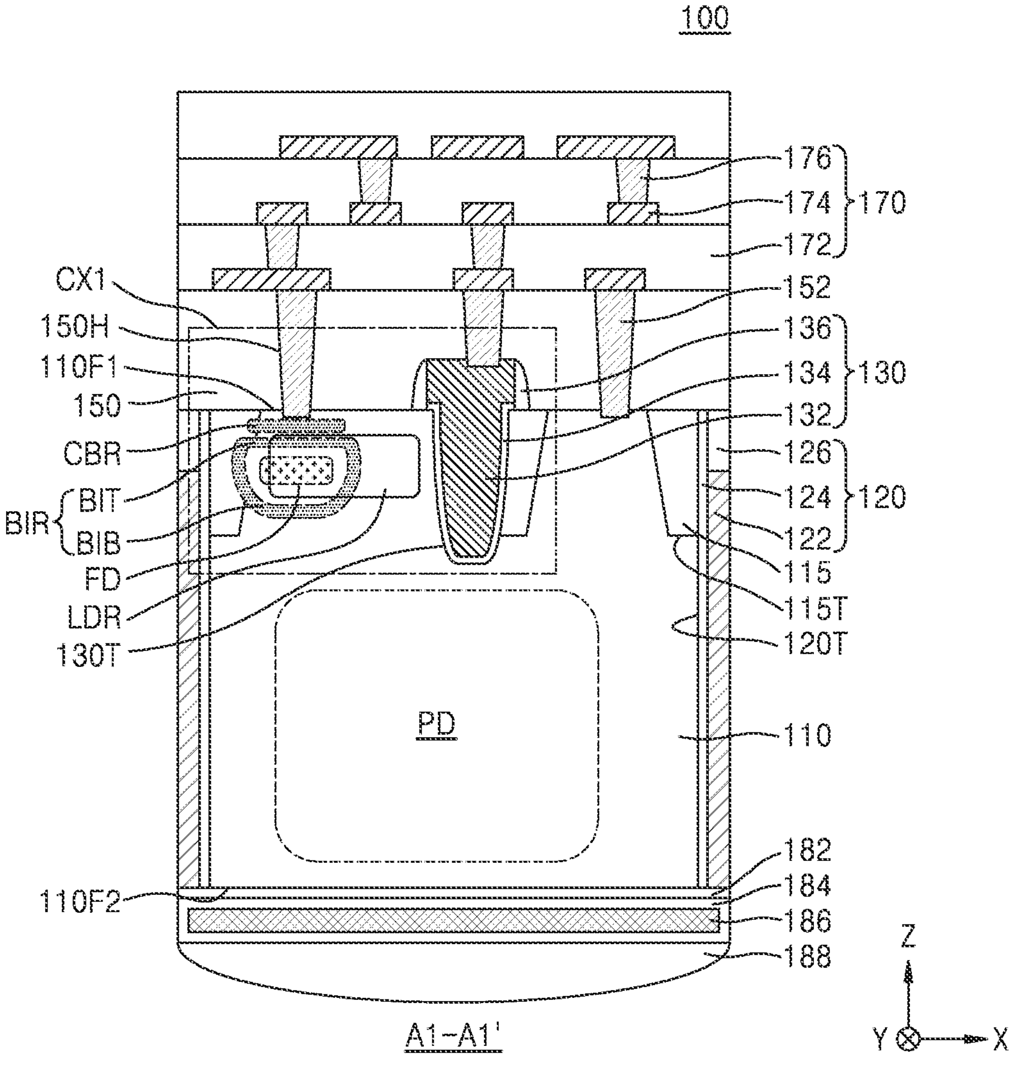
FIG. 3 is a cross-sectional view taken along line A1-A1' in FIG. 2.
Figure 4:
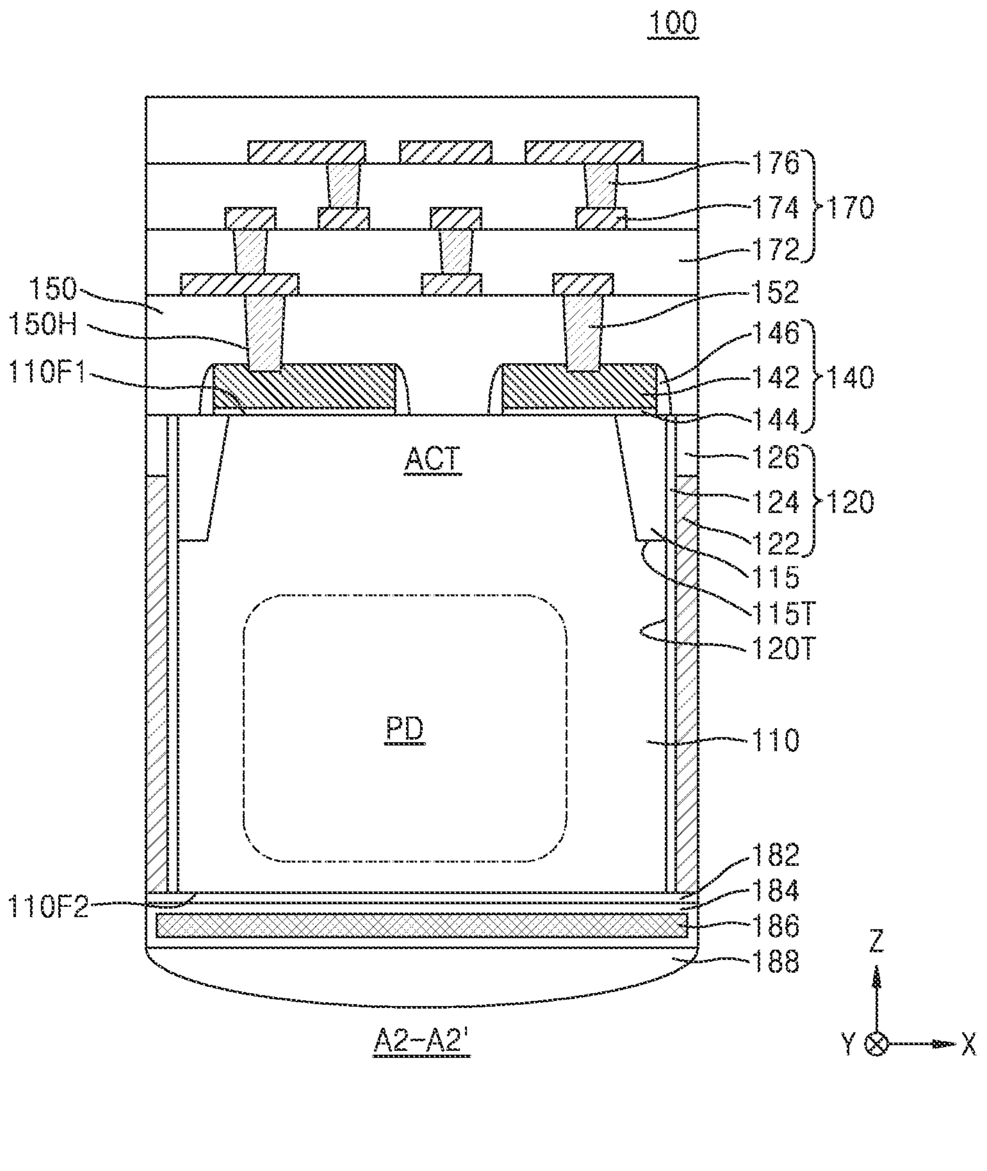
FIG. 4 is a cross-sectional view taken along line A2-A2' in FIG. 2.
Figure 5:
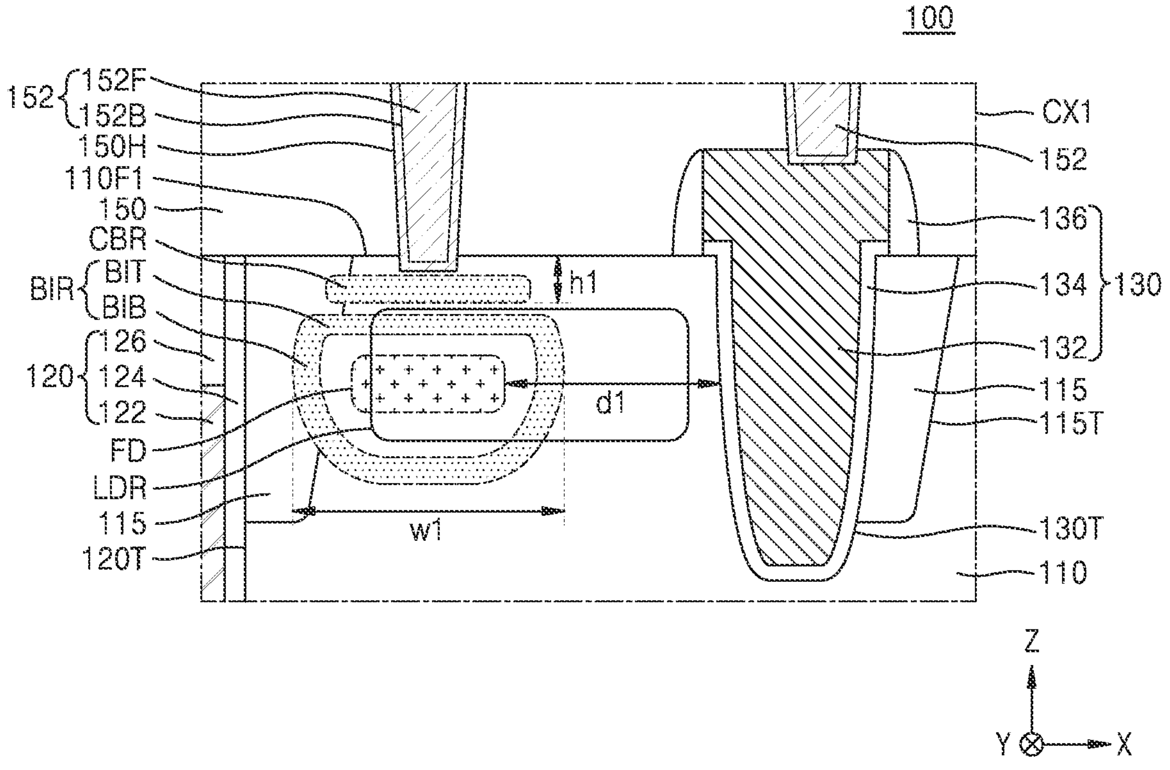
FIG. 5 is an enlarged view of region 'CX1' indicated in FIG. 3.

FIG. 1 is plan view illustrating an example of an image sensor 100, FIG. 2 is an enlarged plan view of region 'II' in FIG. 1, FIG. 3 is a cross-sectional view taken along the line A1-A1' of FIG. 2, FIG. 4 is a cross-sectional view taken along line A2-A2' of FIG. 2, and FIG. 5 is an enlarged view of region 'CX1' of FIG. 3.

Referring collectively to FIGS. 1, 2, 3, 4, and 5 (hereafter collectively, "FIGS. 1 to 5"), the image sensor 100 may include an active pixel region APR formed in a semiconductor substrate 110, a peripheral circuit region PCR, and a pad region PDR.

The active pixel region APR may be disposed at the center of the semiconductor substrate 110, and the peripheral circuit region PCR may be disposed on opposing sides of the active pixel region APR. The pad region PDR may be disposed at an edge portion of the semiconductor substrate 110.

The active pixel region APR includes multiple pixels PX, where multiple photoelectric conversion regions PD may be disposed in each of the multiple pixels PX. In the active pixel region APR, the multiple pixels PX may be disposed, for example, in a matrix of columns and rows in a first (or X-) direction parallel with an upper surface of the semiconductor substrate 110 and a second (or Y-) direction parallel with the upper surface of the semiconductor substrate 110 and intersecting the first direction. Some of the multiple pixels PX may be optical black pixels (not shown). Here, the optical black pixels may serve as a reference pixels with respect to the active pixel region APR, and may perform functions such as automatically correcting a dark signal.

Although in the illustrated example of FIG. 1 the peripheral circuit region PCR is shown as being disposed on opposing sides of the active pixel region APR, other implementations are possible. Alternately, the peripheral circuit region PCR may entirely (or substantially) surround the active pixel region APR. Conductive pads PAD may be variously disposed in the pad region PDR. For example, the conductive pads PAD may be disposed on edge portion(s) of the semiconductor substrate 110.

The semiconductor substrate 110 may include a first surface 110F1 and an opposing second surface 110F2. For example, a surface of the semiconductor substrate 110 on which a color filter 186 is disposed may be referred to as the second surface 110F2, and a surface opposing the second surface 110F2 may be referred to as the first surface 110F1.

In some implementations, the semiconductor substrate 110 may include a P-type semiconductor substrate, e.g., a P-type silicon substrate. Alternately, the semiconductor substrate 110 may include a P-type bulk substrate with a P-type and/or an N-type epitaxial-layer grown thereon. Alternately, the semiconductor substrate 110 may include an N-type bulk substrate with a P-type and/or N-type epitaxial-layer grown thereon. In some implementations, the semiconductor substrate 110 is an organic plastic substrate.

Within each active pixel region APR, multiple pixels PX may be arranged in a matrix within the semiconductor substrate 110, and multiple photoelectric conversion regions PD may be arranged in each of the multiple pixels PX. Each photoelectric conversion region PD may be a region doped with one or more N-type impurities, e.g., an N-type doped region. For example, the photoelectric conversion region PD may have an impurity concentration difference between its upper portion and its lower portion, and thus, have a potential gradient. Alternately, the photoelectric conversion region PD may be formed in a structure in which multiple impurity regions are vertically stacked, e.g., in the vertical (Z-) direction. A P-well region (not shown) may be disposed in some regions adjacent to the first surface 110F1 of the semiconductor substrate 110. The P-well region may be disposed adjacent to the photoelectric conversion region PD, and may be a region doped with one or more P-type impurities, e.g., a P-type doped region.

An isolation layer 115 defining an active region ACT may be formed in the first surface 110F1 of the semiconductor substrate 110. The isolation layer 115 may be disposed in an isolation trench 115T having a defined depth in the first surface 110F1 of the semiconductor substrate 110. The isolation layer 115 may include at least one of, for example, silicon oxide, silicon nitride, and silicon oxynitride.

In the active pixel region APR, a pixel separation structure 120 may be disposed in the semiconductor substrate 110. Here, the arrangement of the multiple pixels PX may be defined by the pixel separation structure 120. The pixel separation structure 120 may be disposed between two adjacent photoelectric conversion regions PD of the multiple photoelectric conversion regions PD, where the two adjacent photoelectric conversion regions PD may be physically and electrically separated by the pixel separation structure 120. The pixel separation structure 120 may be disposed between the multiple photoelectric conversion regions PD disposed in a matrix, and may have a grid shape or a mesh shape.

The pixel separation structure 120 may be formed in a pixel trench 120T passing through the semiconductor substrate 110 from the first surface 110F1 of the semiconductor substrate 110 to the second surface 110F2 of the semiconductor substrate 110. The pixel separation structure 120 may include a conductive layer 122, an insulating liner 124, and an upper insulating layer 126.

The insulating liner 124 may be disposed on an inner wall of the pixel trench 120T, and may extend to the second surface 110F2 of the semiconductor substrate 110 from the first surface 110F1 of the semiconductor substrate 110. The conductive layer 122 may be substantially surrounded by the insulating liner 124 and may fill the inside of the pixel trench 120T. The upper insulating layer 126 may be disposed in a portion of the pixel trench 120T adjacent to the first surface 110F1 of the semiconductor substrate 110. The upper insulating layer 126 may be disposed on an upper surface of the conductive layer 122, and may fill an inlet of the pixel trench 120T.

In some implementations, the conductive layer 122 may include at least one of, for example; doped polysilicon, a metal, a metal silicide, a metal nitride, and a metal-containing film. In some implementations, the insulating liner 124 may include a metal oxide, such as hafnium oxide, aluminum oxide, tantalum oxide, etc. In such a case, the insulating liner 124 may serve as a negative fixed charge layer, but the inventive concept are not limited thereto. In some implementations, the insulating liner 124 may include an insulator, such as silicon oxide, silicon nitride, silicon oxynitride, etc. The conductive layer 122 may include at least one of doped polysilicon, a metal, a metal silicide, a metal nitride, and a metal-containing film. The upper insulating layer 126 may include an insulator, such as silicon oxide, silicon nitride, silicon oxynitride, etc.

Transistors associated with a pixel circuit (not shown) may be disposed on the active region ACT. For example, the active region ACT may be a portion of the semiconductor substrate 110 on which a transfer gate TG, a source follower gate SF, a select gate SG, and a reset gate RG are disposed. In a portion of the active region ACT, for example, in a portion of the active region ACT adjacent to the transfer gate TG, a floating diffusion region FD may be disposed.

In some implementations, a first pixel PX-1, a second pixel PX-2, a third pixel PX-3, and a fourth pixel PX-4 may be disposed in a matrix, where the first pixel PX-1 and the fourth pixel PX-4 are disposed side-by-side in the second direction in mirror symmetry, and the first pixel PX-1 and the second pixel PX-2 are disposed side-by-side in the first direction in mirror symmetry, as shown in FIG. 2. Furthermore, the second pixel PX-2, the third pixel PX-3, and the fourth pixel PX-4 may include the transfer gate TG, the source follower gate SF, and the select gate SG, and the first pixel PX-1 may include the transfer gate TG and the reset gate RG. However, the layout of FIG. 2 is merely one example of multiple transistor layouts.

In some implementations, the transfer gate TG may constitute a transfer transistor TX (see FIG. 7), and the transfer transistor TX may transmit charge generated at the photoelectric conversion region PD to the floating diffusion region FD. The reset gate RG may constitute a reset transistor RX (see FIG. 7), and the reset transistor RX may periodically reset charge stored in the floating diffusion region FD. The source follower gate SF may constitute a drive transistor DX (see FIG. 7), and the drive transistor DX may serve as a source follower buffer amplifier, and buffer a signal according to the charge stored in the floating diffusion region FD. The select gate SG may constitute a select transistor SX (see FIG. 7), and perform switching and addressing to select pixels PX.

As illustrated in FIG. 3, the transfer gate TG may be referred to as a buried gate structure 130, and the buried gate structure 130 may be disposed in a buried gate trench 130T extending into the semiconductor substrate 110 from the first surface 110F1 of the semiconductor substrate 110. The reset gate RG, the source follower gate SF, and the select gate SG may be referred to as a planar gate structure 140, and may be disposed on the first surface 110F1 of the semiconductor substrate 110.

In some implementations, the buried gate structure 130 includes a buried gate electrode 132, a buried gate insulating layer 134, and a buried gate spacer 136. The buried gate electrode 132 may include at least one of, for example, doped polysilicon, a metal, a metal silicide, a metal nitride, and a metal-containing film. The buried gate insulating layer 134 may be disposed on an inner wall of the buried gate trench 130T to substantially surround a side wall and a bottom surface of the buried gate electrode 132. The buried gate spacer 136 may be disposed on a side wall of the buried gate electrode 132.

In some implementations, the planar gate structure 140 may include a planar gate electrode 142, a gate insulating layer 144, and a gate spacer 146. The planar gate electrode 142 may be disposed on the first surface 110F1 of the semiconductor substrate 110, and may include at least one of, for example; doped polysilicon, a metal, a metal silicide, a metal nitride, and a metal-containing film. The gate insulating layer 144 may be disposed between the first surface 110F1 of the semiconductor substrate 110 and the planar gate electrode 142, and the gate spacer 146 may be disposed on a side wall of the planar gate electrode 142. The gate spacer 146 may include the same material as a material constituting the buried gate spacer 136.

The floating diffusion region FD may be disposed on one side of the buried gate structure 130 in the semiconductor substrate 110. The floating diffusion region FD may be spaced apart from the buried gate structure 130 at a first distance d1.

In some implementations, the floating diffusion region FD may be a region doped with a at least one first type of impurity, e.g., an N-type impurity, such as phosphorus and/or arsenic. In some implementations, the floating diffusion region FD may be a region of the semiconductor substrate 110 doped with the one or more first types of impurities with a first type of impurity dose ranging from about 1E12 atom/cm$^2$ to about 5E14 atom/cm$^2$, but other implementations are possible. In this disclosure, the term "about" indicates a relative amount of a value, e.g., 5% above or below the value.

A low-doping region LDR may be disposed on one side of the buried gate structure 130 in the semiconductor substrate 110. The low-doping region LDR may be disposed between the floating diffusion region FD and the buried gate structure 130 to substantially surround the floating diffusion region FD.

The low-doping region LDR may be a region doped with a first impurity, e.g., an N-type impurity, such as phosphorus or arsenic. In some implementations, the low-doping region LDR may be a region doped with the first type of an impurity with a second impurity dose in the semiconductor substrate 110, where a concentration of the second impurity dose may be less than a concentration of the first impurity dose. For example, the second impurity dose may range from between about 1E11 atom/$cm^2$ to about 1E13 atom/$cm^2$, but other implementations are possible.

As the low-doping region LDR is disposed between the floating diffusion region FD and the buried gate structure 130 to substantially surround the floating diffusion region FD, a potential profile gradually changing from the buried gate structure 130 to the floating diffusion region FD may be formed in the semiconductor substrate 110. For example, the potential profile from the buried gate structure 130 to the floating diffusion region FD may gradually change without dislocation, e.g., a hump.

An interlayer insulating film 150 may be disposed on the first surface 110F1 of the semiconductor substrate 110. The interlayer insulating film 150 may cover the active region ACT, the isolation layer 115, the buried gate structure 130, and the planar gate structure 140.

In some implementations, the interlayer insulating film 150 may include silicon nitride and silicon oxynitride. In some implementations, an etch stop layer (not shown) may be disposed between the interlayer insulating film 150 and the first surface 110F1 of the semiconductor substrate 110, and the etch stop layer may include a material having an etch selectivity with respect to the interlayer insulating film 150.

A contact 152 may contact the semiconductor substrate 110, the buried gate structure 130, and the planar gate structure 140 by passing through the interlayer insulating film 150 and the isolation layer 115. For example, the contact 152 may include a first contact CA1 (see FIG. 2) connected to an upper surface of the semiconductor substrate 110, and a second contact CA2 (see FIG. 2) connected to an upper surface of the buried gate structure 130 or the planar gate structure 140.

The contact 152 may be disposed in a contact hole 150H passing through the interlayer insulating film 150. In some implementations, the contact 152 may include a barrier conductive layer 152B disposed on an inner wall of the contact hole 150H and a contact conductive layer 152F filling the inside of the contact hole 150H on the barrier conductive layer 152B. For example, the barrier conductive layer 152B may include at least one of, for example; titanium (Ti), titanium nitride (TiN), tantalum (Ta), tantalum nitride (TaN), ruthenium (Ru), tungsten nitride (WN), and niobium nitride (NbN). The contact conductive layer 152F may include at least one of, for example; tungsten (W), cobalt (Co), copper (Cu), aluminum (Al), and tungsten nitride (WN).

A contact barrier region CBR may be disposed between the floating diffusion region FD and the contact 152 in the semiconductor substrate 110. In some implementations, the contact barrier region CBR may be a region doped with a second type of impurity, such as carbon and/or germanium. For example, the contact barrier region CBR may include carbon and/or germanium in a concentration that ranges from about 1E19 atom/$cm^2$ to about 5E21 atom/$cm^2$. In some implementations, the contact barrier region CBR may be a region formed by doping carbon and/or germanium in a dose that ranges from about 1E14 atom/$cm^2$ to about 5E15 atom/$cm^2$.

The contact barrier region CBR may be disposed at a higher (vertical) level than the floating diffusion region FD, e.g., closer to the first surface 110F1 of the semiconductor substrate 110 than the floating diffusion region FD, and may have a width greater than that of the contact 152 to cover the entire bottom surface of the contact 152. The bottom surface of the contact barrier region CBR may have a first height h1 from the first surface 110F1 of the semiconductor substrate 110, and the first height h1 may be less than or equal to about 500 Å. In some implementations, the first height h1 may be less than or equal to about 200 Å.

The contact barrier region CBR may serve as a barrier that prevents metal atoms included in the contact 152, e.g., transition metal atoms included in the barrier conductive layer 152B, from diffusing into the semiconductor substrate 110 under the influence of, for example, a heat treatment process following an ion implantation process during the manufacture of the image sensor 100 from becoming a source of leakage current. That is, carbon and/or germanium atoms may apply stress to the semiconductor substrate 110 below the contact 152 and serve as gettering atoms that suppress or prevent transition metal atoms included in the contact 152 from moving (or diffusing) into the semiconductor substrate 110.

A barrier impurity region BIR may be disposed in the semiconductor substrate 110 to substantially surround the floating diffusion region FD. In some implementations, the barrier impurity region BIR may be a region doped with a second type of impurity, such as carbon and/or germanium. For example, the barrier impurity region BIR may include carbon and/or germanium in a concentration ranging from between about 1E19 atom/$cm^2$ to about 5E21 atom/$cm^2$. For example, the barrier impurity region BIR may be a region formed by doping carbon and/or germanium with a dose ranging from about 1E14 atom/$cm^2$ to about 5E15 atom/$cm^2$.

In this regard, carbon and/or germanium may apply stress around the floating diffusion region FD and serve as gettering atoms that suppress or prevent impurity atoms included in the floating diffusion region FD from diffusing outwardly, and the barrier impurity region BIR may function as a barrier including such gettering atoms. That is, the generation of the leakage current potentially caused by outward migration or diffusion of impurities from the floating diffusion region FD under the influence of, for example, a heat treatment process following the ion implantation process during the manufacture of the image sensor 100 may be suppressed.

As illustrated in FIG. 5, the barrier impurity region BIR may include a top region BIT disposed on the floating diffusion region FD and a bottom region BIB substantially surrounding a bottom portion and a lateral side of the floating diffusion region FD. For example, the top region BIT may be disposed at a higher level than the floating diffusion region FD, e.g., closer to the first surface 110F1 than the floating diffusion region FD. The bottom region BIB may be disposed at a lower level than the top region BIT, e.g., further from the first surface 110F1 than the top region BIT. For example, a bottom surface of the bottom region BIB may have a height ranging from about 500 Å to about 1500 Å from the first surface 110F1 of the semiconductor substrate 110. The barrier impurity region BIR may have a first width w1 in the first direction greater than a width of the floating diffusion region FD or a width of the contact 152.

In some implementations, the top region BIT may be disposed vertically separate (or apart) from the contact barrier region CBR at a lower level than the contact barrier region CBR, as shown in FIG. 5. However, In some implementations, an upper portion of the top region BIT may contact a bottom portion of the contact barrier region CBR.

In some implementations, the barrier impurity region BIR may be formed by forming the bottom region BIB in the semiconductor substrate 110 through the ion implantation process (or process), and then forming the top region BIT in the semiconductor substrate 110 through the ion implantation process.

An upper wiring structure 170 may be disposed on the interlayer insulating film 150. The upper wiring structure 170 may have a stacked structure including multiple layers. The upper wiring structure 170 may include an insulating layer 172, a wiring layer 174, and a via contact 176. The insulating layer 172 may include an insulator, such as silicon oxide, silicon nitride, silicon oxynitride, etc. The wiring layer 174 and the via contact 176 may include at least one of, for example; doped polysilicon doped, undoped polysilicon, a metal, a metal silicide, a metal nitride, and a metal-containing film. For example, the wiring layer 174 and the via contact 176 may include at least one of, for example; tungsten, aluminum, copper, tungsten silicide, titanium silicide, tungsten nitride, titanium nitride, and doped polysilicon.

A rear insulating layer 182 may be disposed on the second surface 110F2 of the semiconductor substrate 110. The rear insulating layer 182 may be disposed over substantially the entire area of the second surface 110F2 of the semiconductor substrate 110, and may contact an upper surface of the pixel separation structure 120 disposed at the same level as the second surface 110F2 of the semiconductor substrate 110. In some implementations, the rear insulating layer 182 may include at least one of, for example; a metal and an oxide, such as hafnium oxide, aluminum oxide and tantalum oxide. In some implementations, the rear insulating layer 182 may include an insulating material, such as silicon oxide, silicon nitride, silicon oxynitride, a low-k dielectric material, etc.

A passivation layer 184 may be disposed on the rear insulating layer 182, and a color filter 186 and a microlens 188 may be disposed on the passivation layer 184. A support substrate (not shown) may be further disposed on the first surface 110F1 of the semiconductor substrate 110.

Here, the transfer gate TG, e.g., the buried gate structure 130, may transmit electrical charge (hereafter, "charge") generated at the photoelectric conversion region PD to the floating diffusion region FD, the floating diffusion region FD may accumulatively store the charge, and the drive transistor DX may be controlled according to an amount of photo-charge accumulated in the floating diffusion region FD. However, as the size of pixels in the image sensor decrease, a distance between the transfer gate TG and the floating diffusion region FD may decrease, and as a result, impurity atoms associated with the floating diffusion region FD may migrate or diffuse into the semiconductor substrate 110 under the influence, for example, of a heat treatment process following the ion implantation process. Accordingly, a gate-induced drain leakage GIDL type leakage current may occur and optical properties of the image sensor may be degraded.

However, by disposing the contact barrier region CBR between the floating diffusion region FD and the contact 152, the barrier impurity region BIR may be disposed around the floating diffusion region FD, and the contact barrier region CBR and the barrier impurity region BIR may include gettering atoms, such as carbon and/or germanium. Hence, the contact barrier region CBR and the barrier impurity region BIR may function as a barrier that suppresses or prevents migration or diffusion of impurities under the influence of, for example, a heat treatment process following the ion implantation process, thereby suppressing generation of leakage current in the image sensor 100.

Figure 6:
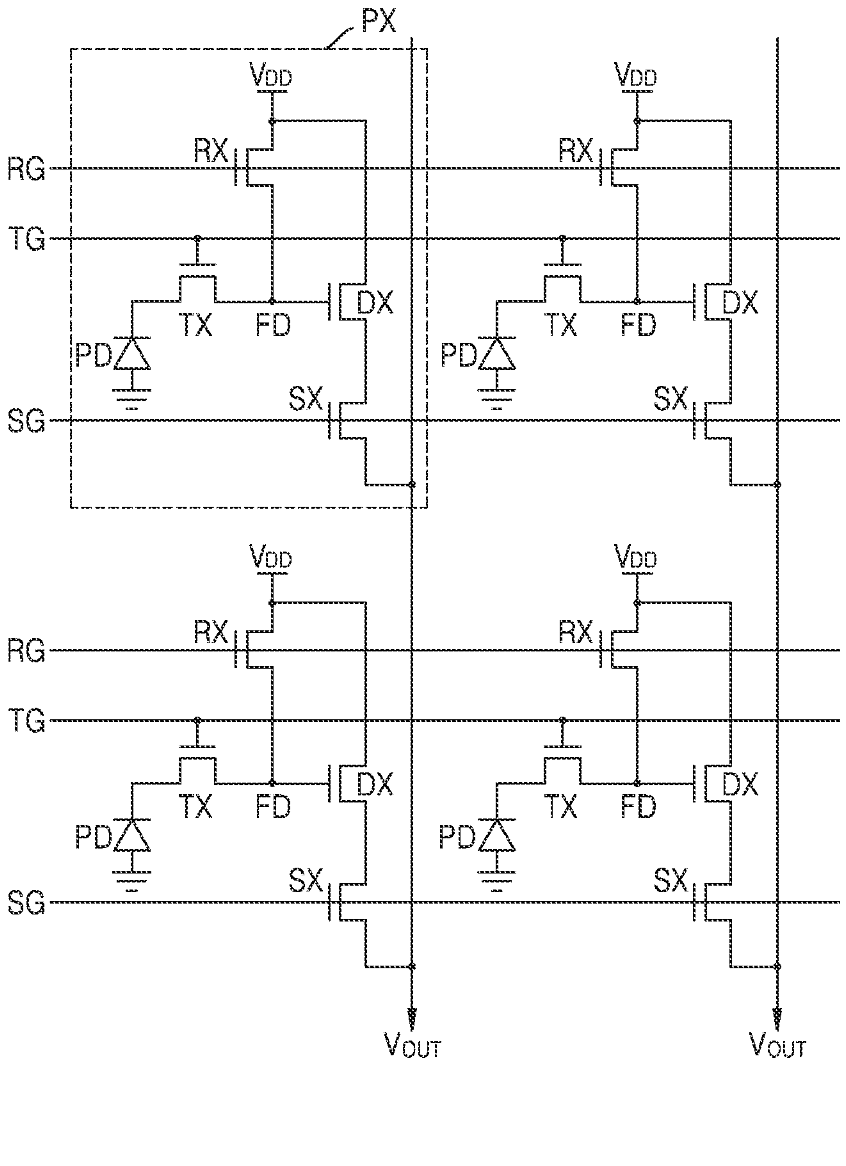
FIG. 6 is an example of an equivalent circuit diagram for an image sensor.

FIG. 6 is an example of an equivalent circuit diagram of the pixels PX of the image sensor 100.

Referring to FIG. 6, it is assumed that the multiple pixels PX is disposed in a matrix, and each of the multiple pixels PX includes the transfer transistor TX and logic transistors. Here, the logic transistors may include the reset transistor RX, the select transistor SX, and the drive transistor DX (or source follower transistor). The reset transistor RX may include the reset gate RG, the select transistor SX may include the select gate SG, the drive transistor DX may include the source follower gate SF, and the transfer transistor TX may include the transfer gate TG.

Each of the multiple pixels PX may further include the photoelectric conversion region PD and the floating diffusion region FD. The photoelectric conversion region PD may correspond to the photoelectric conversion region PD described in relation to FIGS. 1 to 5. The photoelectric conversion region PD may generate and accumulate photo-charge in proportion to an amount of incident light, and may include a photodiode, a phototransistor, a photo gate, a pinned photodiode (PPD) or a combination thereof.

The transfer gate TG may transmit charge generated at the photoelectric conversion region PD to the floating diffusion region FD. The floating diffusion region FD may receive the charge generated at the photoelectric conversion region PD and accumulatively store the received charge. The drive transistor DX may be controlled according to an amount of photo-charge accumulated in the floating diffusion region FD.

The reset transistor RX may periodically reset charge accumulated in the floating diffusion region FD. A drain electrode of the reset transistor RX may be connected to the floating diffusion region FD, and a source electrode may be connected to a power voltage $V_{DD}$. When the reset transistor RX is turned ON, the power voltage $V_{DD}$ connected to the source electrode of the reset transistor RX may be transmitted to the floating diffusion region FD. When the reset transistor RX is turned ON, the charge accumulated in the floating diffusion region FD may be discharged, and the floating diffusion region FD may be reset.

The drive transistor DX may be connected to a current source (not shown) disposed outside of the multiple pixels PX, function as a source follower buffer amplifier, and amplify a potential change at the floating diffusion region FD to output the amplified potential change to an output line $V_{OUT}$.

The select transistor SX may select the multiple pixels PX on a row basis, and when the select transistor SX is turned ON, the power voltage $V_{DD}$ may be transmitted to a source electrode of the drive transistor DX.

Figure 7:
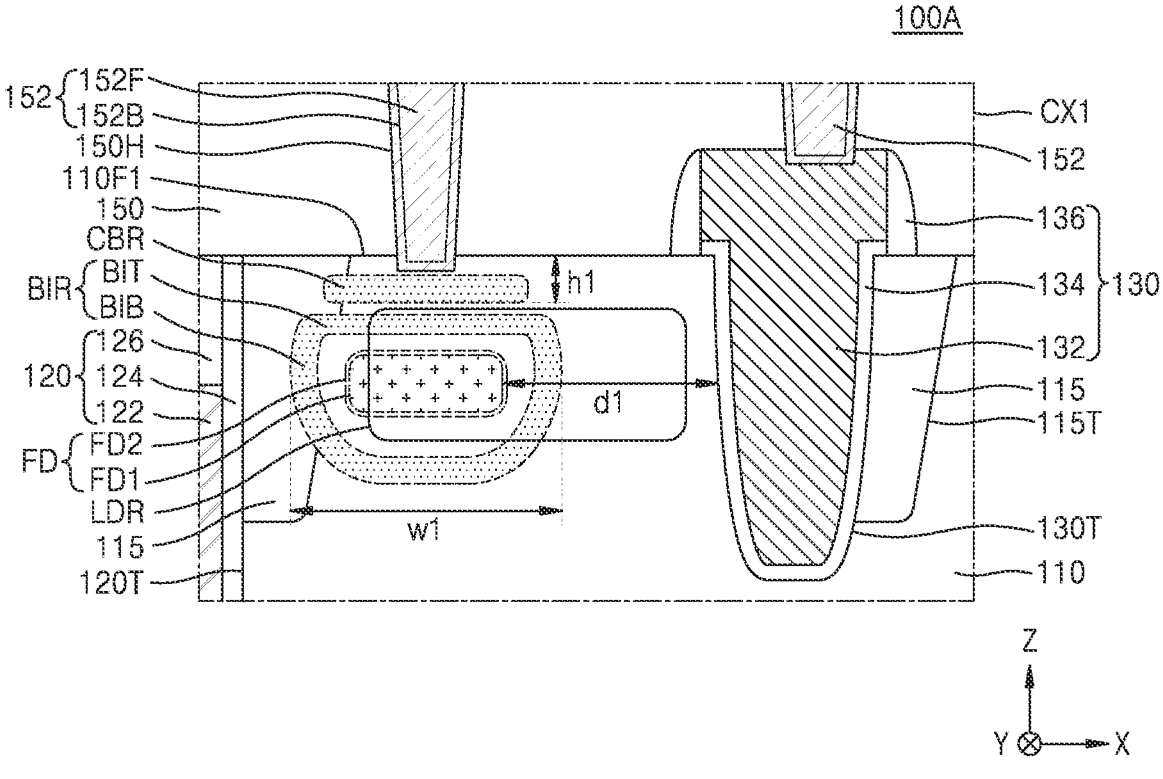
FIG. 7 is a cross-sectional view illustrating an example of an image sensor.

FIG. 7 is a cross-sectional view of an example of an image sensor 100A.

Referring to FIG. 7, the floating diffusion region FD may include a first type of impurity region FD1 and a second type of impurity region FD2 disposed in at least a partially overlapping arrangement. In some implementations, the first type of impurity region FD1 may be a region doped with a first type of impurity, such as phosphorus and/or arsenic. In some implementations, the second type of impurity region FD2 may be a region doped with a second type of impurity, such as carbon and/or germanium.

In some implementations, the first type of impurity region FD1 may be a region of the semiconductor substrate 110 doped with a first type of impurity dose ranging from about 1E12 atom/$cm^2$ to about 5E14 atom/$cm^2$, but other implementations are possible. The second type of impurity region FD2 may be a region of the semiconductor substrate 110 doped with a second type of impurity dose ranging from about 1E14 atom/$cm^2$ to about 5E15 atom/$cm^2$, but other implementations are possible.

The low-doping region LDR may be a region doped with a first type of impurity, such as phosphorus and/or arsenic.

As one example, the embodiment of FIG. 7 assumes that the first type of impurity region FD1 and the second type of impurity region FD2 have about the width and about the same height. The embodiment of FIG. 7 also assumes that and most of the area of the first type of impurity region FD1 and most of the area of the second type of impurity region FD2 overlap. However, those skilled in the art will recognize that the width and/or height of the second type of impurity region FD2 may differ from that of the first type of impurity region FD1. Further, the area of the first type of impurity region FD1 and the area of the second type of impurity region FD2 may overlap to a greater or lesser extent.

The second type of impurity included in the second type of impurity region FD2 of the floating diffusion region FD may apply stress around the floating diffusion region FD, and provide gettering atoms that suppress or prevent outward migration or diffusion of the first type of impurity atoms included in the floating diffusion region FD into surrounding regions of the semiconductor substrate 110. As a result, leakage current due to outward migration or diffusion of the first type impurities from the floating diffusion region FD may be suppressed or prevented by an electromagnetic field formed around the buried gate structure 130 when a voltage is applied to the buried gate structure 130.

Figure 8:
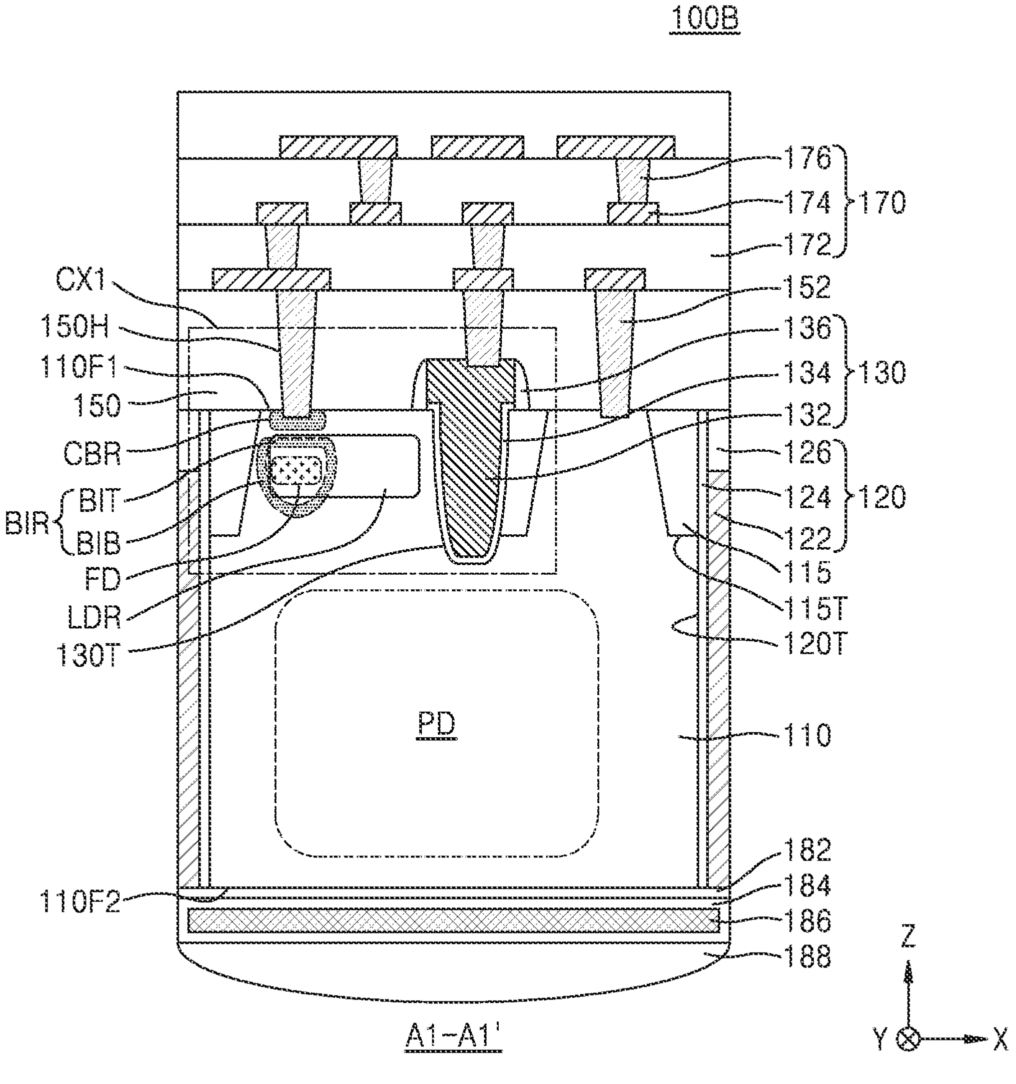
FIG. 8 is a cross-sectional view illustrating an example of an image sensor.
Figure 9:
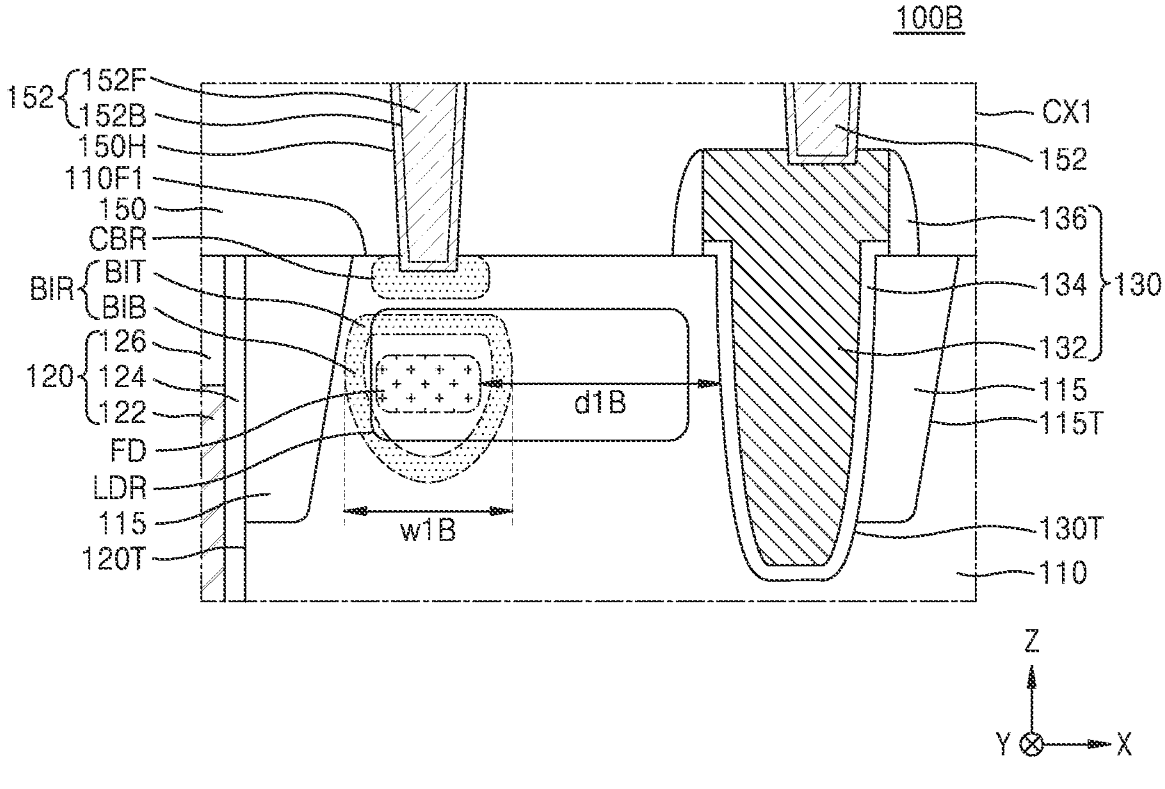
FIG. 9 is an enlarged view of region 'CX1' indicated in FIG. 8.

FIG. 8 is a cross-sectional view of an example of an image sensor 100B according to embodiments of the inventive concept, and FIG. 9 is an enlarged view of region 'CX1' indicated in FIG. 8.

Referring to FIGS. 8 and 9, the contact barrier region CBR may be disposed adjacent to the first surface 110F1 of the semiconductor substrate 110, and may be formed by the ion implantation process from a bottom portion of the contact hole 150H. For example, the contact barrier region CBR may have a width in the first direction that is greater than a width of the contact 152 in the first direction, and a center line (not shown) of the contact 152 in the first direction may match a center line (not shown) of the contact barrier region CBR in the first direction.

The floating diffusion region FD may be formed by the ion implantation process from the bottom portion of the contact hole 150H. The floating diffusion region FD may be spaced apart from the buried gate structure 130 at a first distance d1B. The first distance d1B may be greater than the first distance d1 between the floating diffusion region FD and the buried gate structure 130 described Referring to FIGS. 1 to 4.

The barrier impurity region BIR may be formed by the ion implantation process from the bottom portion of the contact hole 150H. Also, a width w1B of the barrier impurity region BIR in the first direction may be less than the width w1 of the barrier impurity region BIR in the first direction described Referring to FIGS. 1, 2, 3 and 4.

Figure 10:
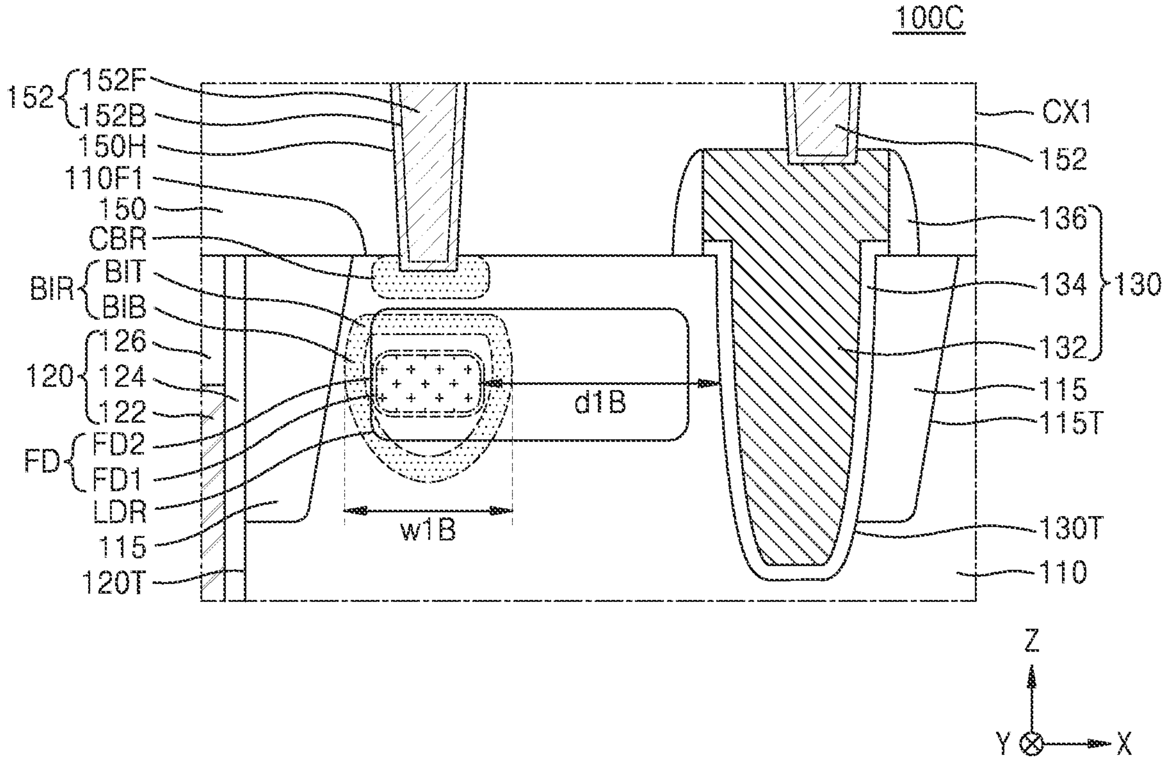
FIG. 10 is a cross-sectional view illustrating an example of an image sensor.

FIG. 10 is a cross-sectional view of an example of an image sensor 100C.

Referring to FIG. 10, the floating diffusion region FD may include a first type of impurity region FD1 and a second type of impurity region FD2 disposed so as to at least partially overlap each other. In some implementations, the first type of impurity region FD1 may be a region doped with the first type of impurity, such as phosphorus and/or arsenic. The second type of impurity region FD2 may be a region doped with the second type of impurity, such as carbon and/or germanium. The first type of impurity region FD1 and the second type of impurity region FD2 may be formed by the ion implantation process from the bottom portion of the contact hole 150H.

Figure 11:
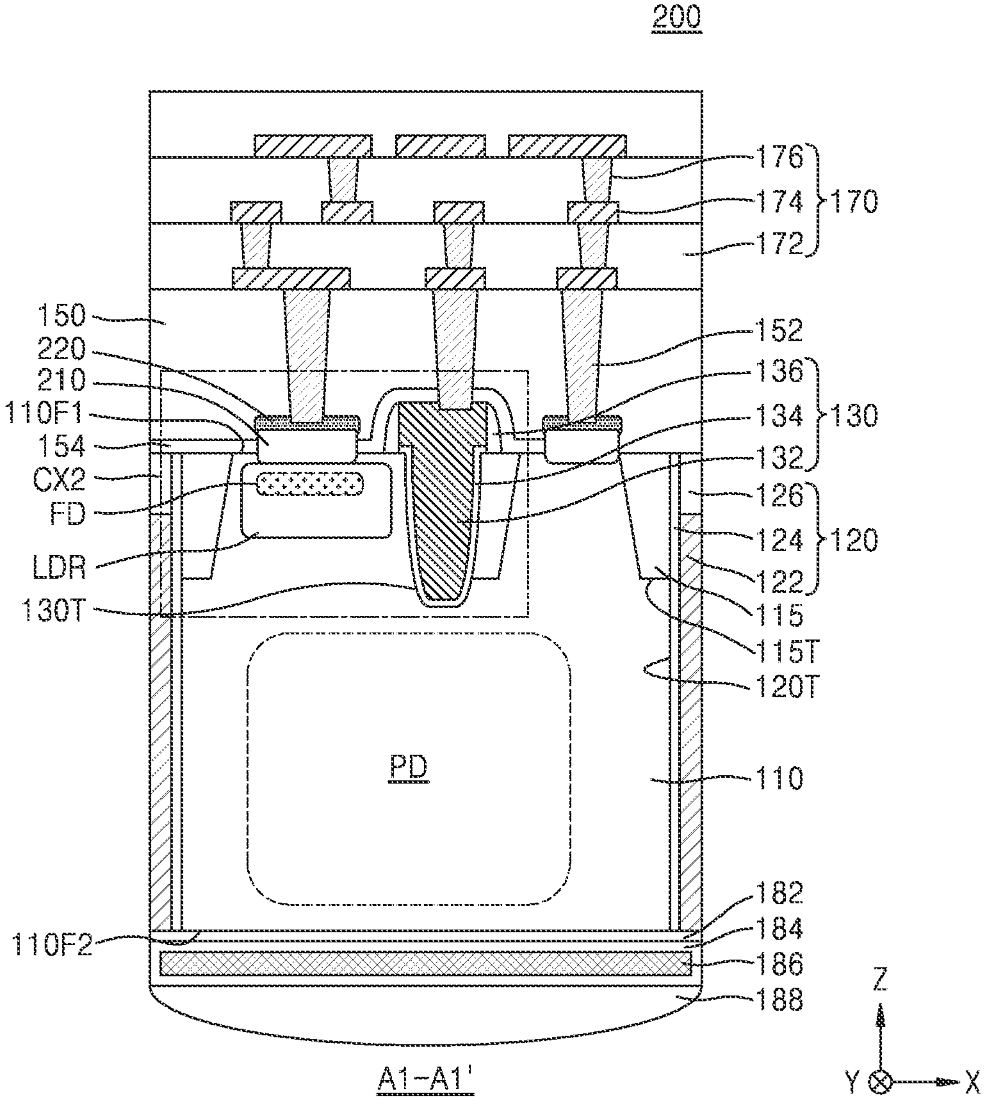
FIG. 11 is a cross-sectional view illustrating an example of an image sensor.
Figure 12:
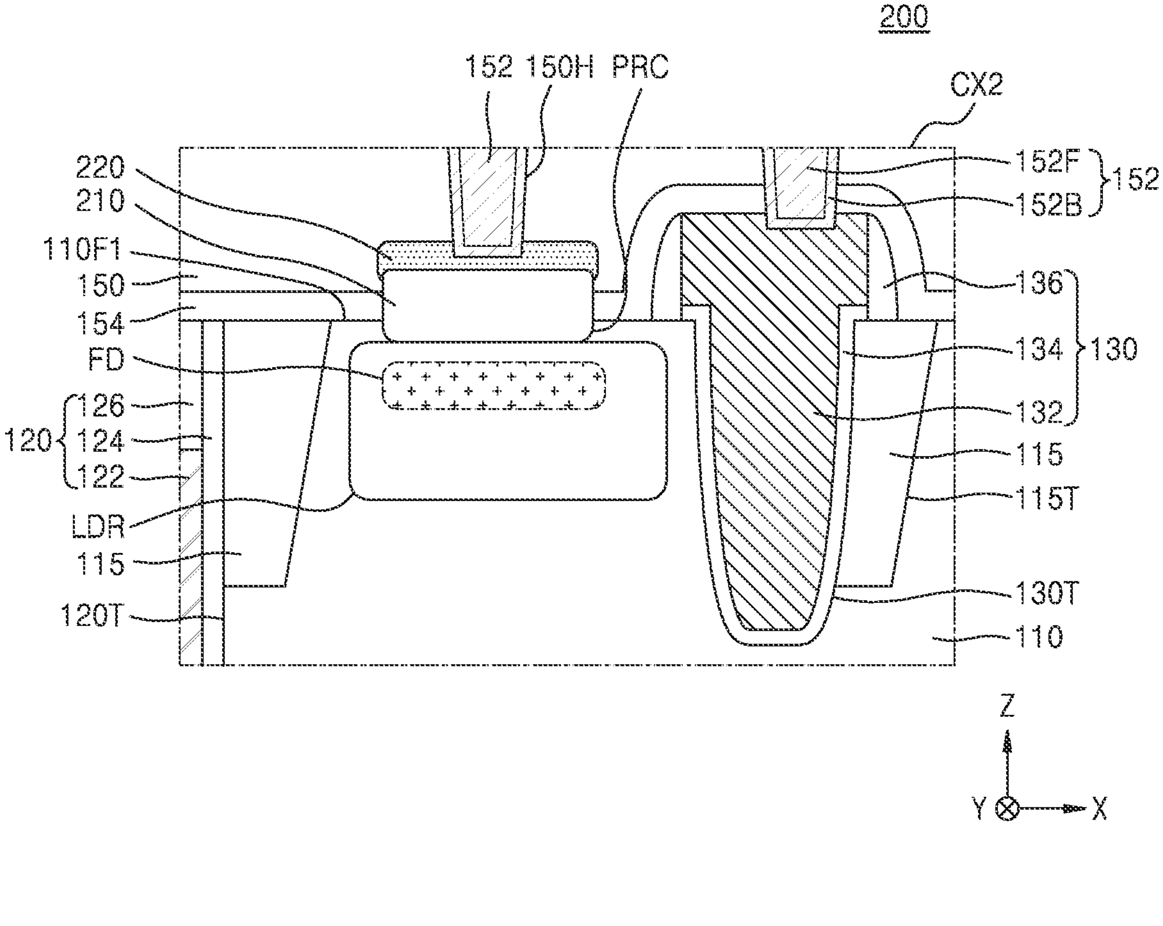
FIG. 12 is an enlarged view of region 'CX2' indicated in FIG. 11.

FIG. 11 is a cross-sectional view illustrating an example of an image sensor. FIG. 12 is an enlarged view of region 'CX2' indicated in FIG. 11.

Referring to FIGS. 11 and 12, a contact pad 210 may be disposed on the upper surface of the semiconductor substrate 110, an intermediate layer 220 may be disposed on the contact pad 210, and the contact 152 may be disposed on the intermediate layer 220. An etch stop layer 154 may be disposed between the first surface 110F1 of the semiconductor substrate 110 and the interlayer insulating film 150, and the etch stop layer 154 may conformally cover the buried gate structure 130.

In some implementations, the contact 152 may be formed to vertically overlap the floating diffusion region FD and thus provide electrical connection with the floating diffusion region FD. In some implementations, the contact 152 may be formed to vertically overlap a ground region GND and thus provide electrical connection with the group region GND. In some implementations, the contact 152 may be disposed on the active region ACT and provide electrical connection with a source region or a drain region of a pixel transistor, e.g., a reset gate RG, a select gate SG, or a source follower gate SF.

In some implementations, the contact pad 210 may be disposed vertically apart from the buried gate structure 130, and an upper surface of the contact pad 210 may be disposed at a higher vertical level than the first surface 110F1 of the semiconductor substrate 110. In some implementations, as illustrated in FIG. 11, the contact pad 210 may be disposed in a pad recess PRC provided in the first surface 110F1 of the semiconductor substrate 110. For example, the pad recess PRC may be formed by removing a part of the semiconductor substrate 110 from the first surface 110F1 of the semiconductor substrate 110. Accordingly, a bottom surface of the contact pad 210 may be disposed at a lower level than the first surface 110F1 of the semiconductor substrate 110, and an upper surface of the contact pad 210 may be disposed at a higher level than the first surface 110F1 of the semiconductor substrate 110. In some implementations, the pad recess PRC may not be formed and the bottom surface of the contact pad 210 may be disposed at the same level as the first surface 110F1 of the semiconductor substrate 110.

In some implementations, the contact pad 210 may include polysilicon. The contact pad 210 may further include an N-type impurity such as phosphorus or arsenic. The contact pad 210 may function as an elevated source/drain region.

In some implementations, the contact pad 210 may include a gettering atom including carbon or germanium. For example, the gettering atom including carbon or germanium included in the contact pad 210 may serve as a barrier that prevents metal atoms included in the contact 152 from being diffused into the semiconductor substrate 110 by a field applied between the buried gate structure 130 and the floating diffusion region FD and becoming a source of a leakage current.

In some implementations, the intermediate layer 220 may be disposed between the contact 152 and the contact pad 210 and may reduce contact resistance between the contact 152 and the contact pad 210. For example, the intermediate layer 220 may include a metal silicide such as a tungsten silicide, a nickel silicide, a cobalt silicide, a titanium silicide, etc.

In general, when the size of pixels of the image sensor decreases, the distance between the transfer gate TG and the floating diffusion region FD may also be reduced. Accordingly, impurity atoms associated with the floating diffusion region FD may migrate or diffuse into the semiconductor substrate 110 under the influence of a heat treatment process performed after the ion implantation process. Due to this, a gate-induced drain leakage (GIDL) type leakage current may occur and optical properties of the image sensor may be degraded.

However, by disposing the contact pad 210 and the intermediate layer 220 between the contact 152 and the first surface 110F1 of the semiconductor substrate 110, the physical distance between the transfer gate TG and the floating diffusion region FD increases and the contact resistance decreases.

Figure 13:
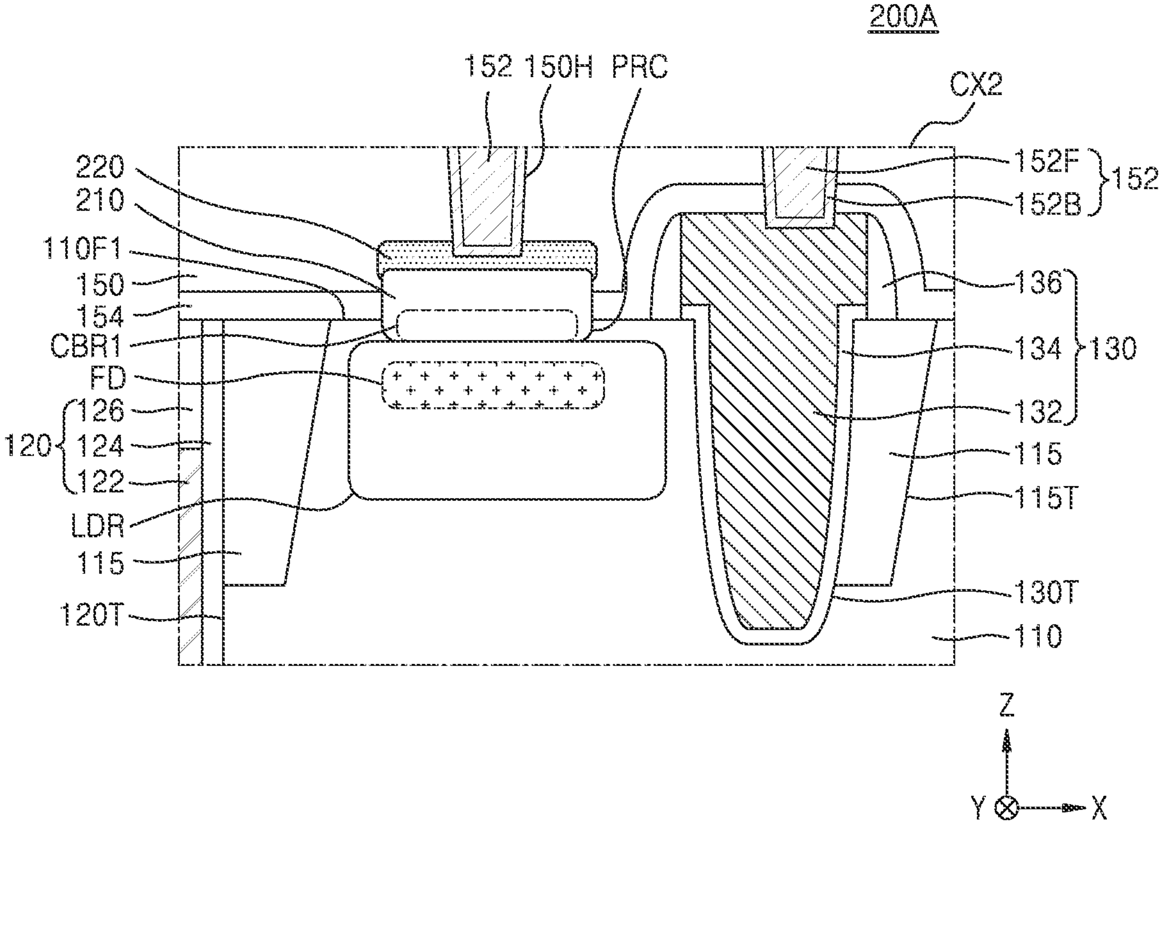
FIG. 13 is a cross-sectional view illustrating an example of an image sensor.

FIG. 13 is a cross-sectional view illustrating an example of an image sensor 200A.

Referring to FIG. 13, the contact barrier region CBR1 may be disposed at a lower portion of the contact pad 210. The contact barrier region CBR1 may be disposed at a higher vertical level than the floating diffusion region FD and may be formed by ion-implanting the gettering atom including carbon or germanium into the lower portion of the contact pad 210.

The contact barrier region CBR1 may serve as a barrier that prevents metal atoms included in the contact 152, from diffusing into the semiconductor substrate 110 under the influence of, for example, a heat treatment process following an ion implantation process during the manufacture of the image sensor 200A, and becoming a source of leakage current.

In some implementations, the barrier impurity region BIR (see FIG. 3) described in relation to FIGS. 1 to 5 may be further formed around the floating diffusion region FD. The barrier impurity region BIR may refer to a region doped with the gettering atom including carbon or germanium, and the barrier impurity region BIR may be disposed to surround the floating diffusion region FD in the semiconductor substrate 110.

Figure 14:
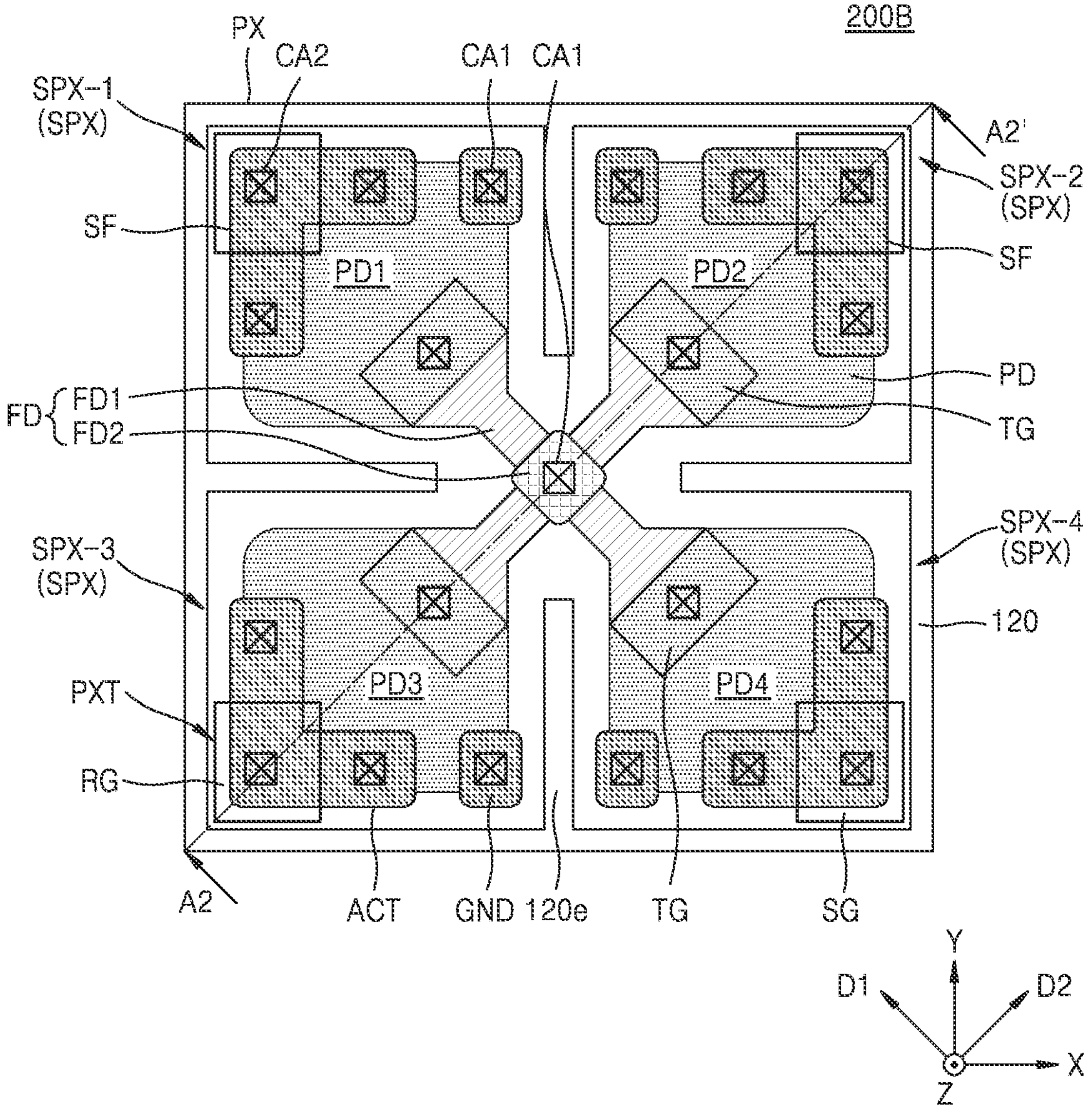
FIG. 14 is a layout view illustrating an example of an image sensor.
Figure 15:
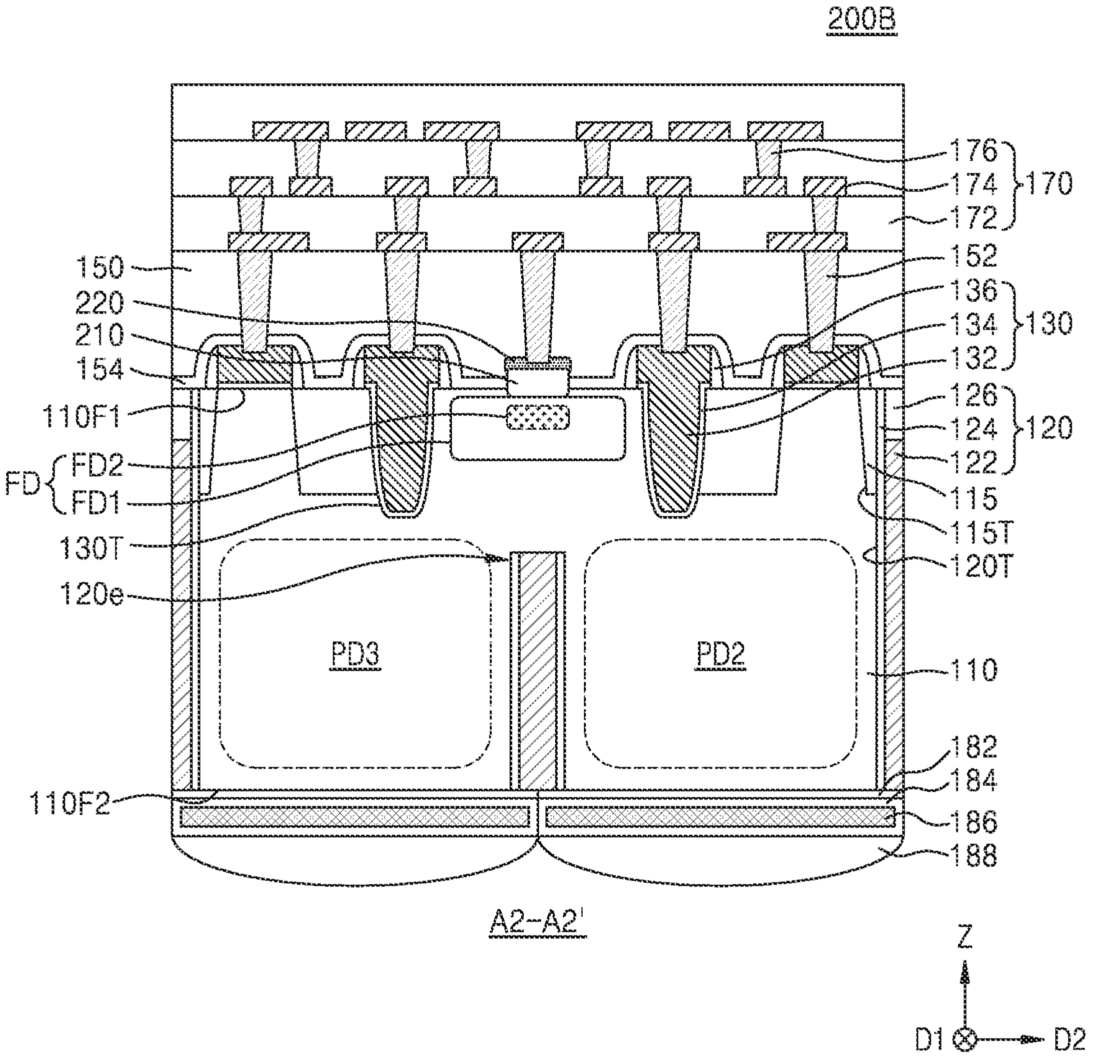
FIG. 15 is a cross-sectional view taken along line A2-A2' in FIG. 14.

FIG. 14 is a layout view illustrating an example of an image sensor 200B. FIG. 15 is a cross-sectional view taken along line A2-A2' in FIG. 14.

Referring to FIGS. 14 and 15, multiple photoelectric conversion regions PD may be disposed in one pixel PX surrounded by the pixel separation structure 120. For example, as illustrated in FIG. 2, one pixel PX may include first to fourth subpixel regions SPX-1 to SPX-4, and first to fourth photoelectric conversion regions PD1 to PD4 may be respectively disposed in the first to fourth subpixel regions SPX-1 to SPX-4. The floating diffusion region FD may be disposed in a central area of the pixel PX, and the first to fourth subpixel regions SPX-1 to SPX-4 may share one floating diffusion region FD. Four photoelectric conversion regions PD may be disposed adjacent to the floating diffusion region FD.

In some implementations, the pixel separation structure 120 may include a lateral extension 120*e* extending in the first (X) direction and the second (Y) direction towards a central portion of the pixel PX. The lateral extension 120*e* may be disposed between two subpixel regions SPX disposed in the first (X) direction and between two subpixel regions SPX disposed in the second (Y) direction. In some implementations, a portion of the lateral extension 120*e* disposed in the central area of the pixel PX may not completely pass through the semiconductor substrate 110 and may extend from the second surface 110F2 of the semiconductor substrate 110 to a level lower than the first surface 110F1 of the semiconductor substrate 110.

In some implementations, the floating diffusion region FD may include a first floating diffusion region FD1 and a second floating diffusion region FD2. The second floating diffusion region FD2 may be disposed in the central area of the pixel PX and may be shared by the first to fourth subpixel regions SPX-1 to SPX-4. The first floating diffusion region FD1 may be disposed between the second floating diffusion region FD2 and the transfer gate TG. For example, the first floating diffusion region FD1 disposed in the first subpixel region SPX-1 may include a first portion disposed adjacent to the second floating diffusion region FD2 and having a rectangular planar shape extending in a first horizontal direction D1 and a second portion disposed adjacent to the transfer gate TG and having a trapezoidal planar shape that increases in width as a distance to the transfer gate TG decreases.

The contact pad 210 and the intermediate layer 220 may be disposed on the second floating diffusion region FD2, and the contact 152 may be disposed on the intermediate layer 220.

Figure 16:
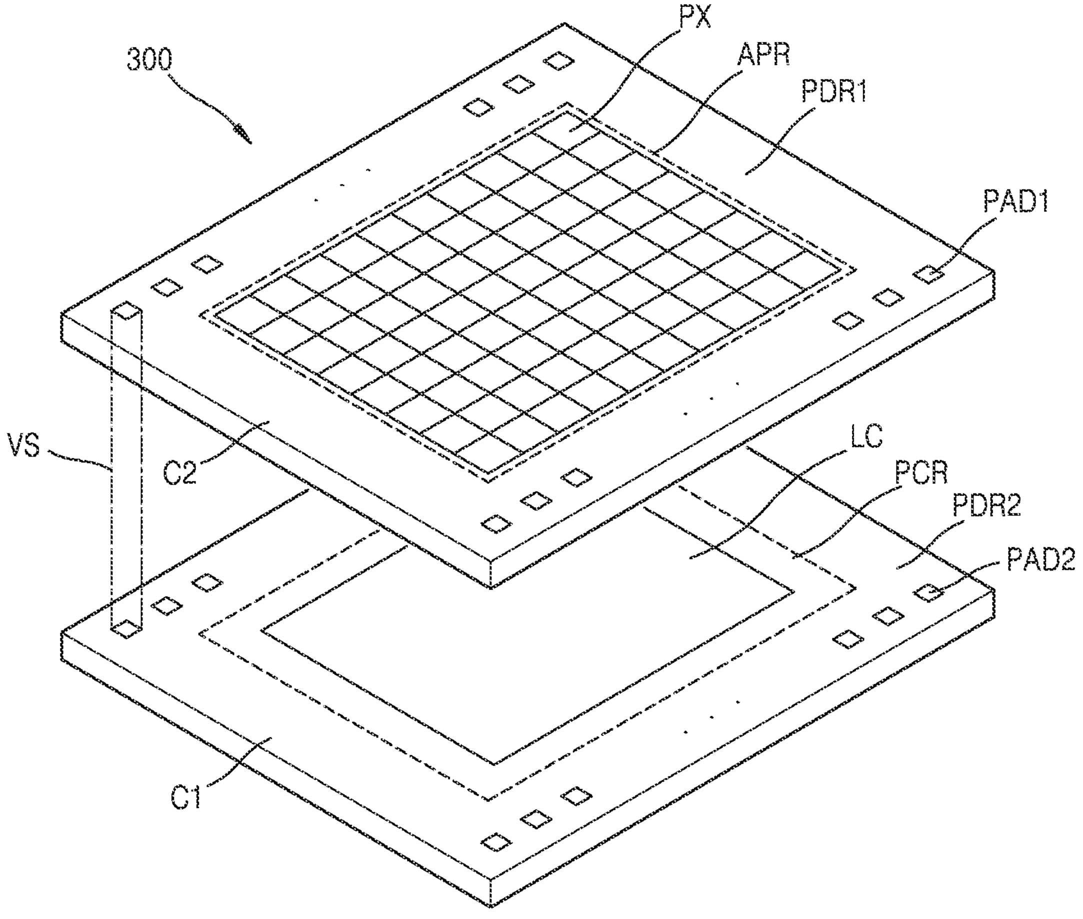
FIG. 16 is a perspective view illustrating an example of an image sensor.

FIG. 16 is a perspective view illustrating an example of an image sensor 300.

Referring to FIG. 16, the image sensor 300 may be a stacked image sensor including a first chip C1 and a second chip C2 vertically stacked one on top of the other. The first chip C1 may include the active pixel region APR and a first pad region PDR1, and the second chip C2 may include the peripheral circuit region PCR and a second pad region PDR2.

Multiple first pads PAD1 of the first pad region PDR1 may receive and transmit an electric signal with an external device. The peripheral circuit region PCR may include a logic circuit block LC and multiple Complementary Metal Oxide Semiconductor (CMOS) transistors. The peripheral circuit region PCR may provide a certain signal to each pixel PX of the active pixel region APR, or control an output signal from each pixel PX. The first pads PAD1 in the first pad region PDR1 may be electrically connected to the second pads PAD2 of the second pad region PDR2 by a via structure VS.

FIGS. 17 to 21, 22A, 22B, and 23 to 31 are cross-sectional views illustrating an example of a method of manufacture for the image sensor 100 of FIGS. 1 to 5. That is, FIGS. 17 to 31, excepting FIG. 22B, are cross-sectional views taken along line A1-A1' of FIG. 2, and FIG. 22B is a cross-sectional view taken along line A2-A2' of FIG. 2.

Figure 17:
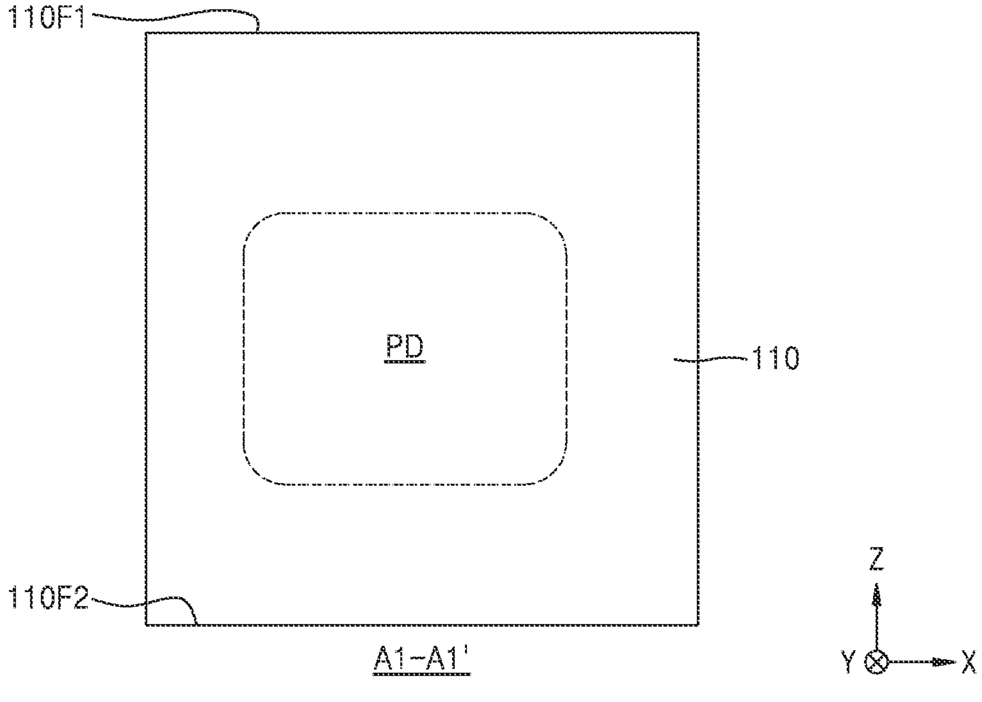
FIGS. 17 to 21, 22A, 22B, and 23 to 31 (hereafter collectively, "FIGS. 17 to 31") are cross-sectional views illustrating an example of a method of manufacture for an image sensor.

Referring to FIG. 17, the semiconductor substrate 110 may be prepared with the first surface 110F1 and the opposing second surface 110F2.

The photoelectric conversion region PD may be formed by the ion implantation process from the first surface 110F1 of the semiconductor substrate 110. For example, the photoelectric conversion region PD may be formed by doping an N-type impurity.

Figure 18:
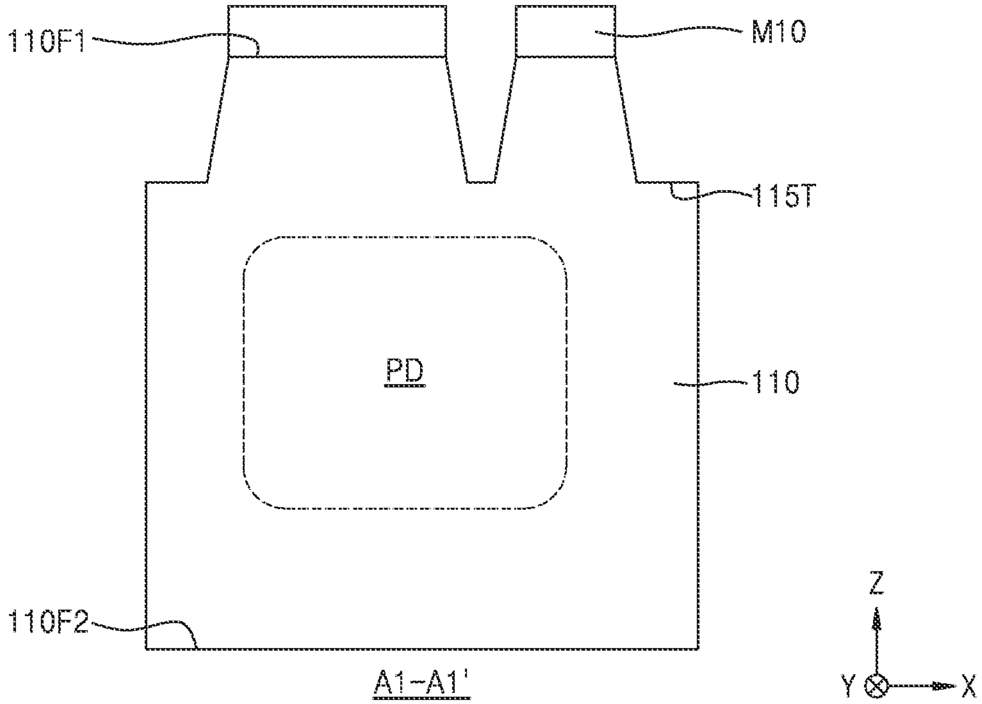

Referring to FIG. 18, a first mask pattern M10 may be formed on the first surface 110F1 of the semiconductor substrate 110, and using the first mask pattern M10 as an etch mask, the isolation trench 115T may be formed in the semiconductor substrate 110.

In some implementations, the isolation trench 115T may be formed to have a height ranging from about 100 nm to about 500 nm in the vertical direction, but other implementations are possible.

Figure 19:
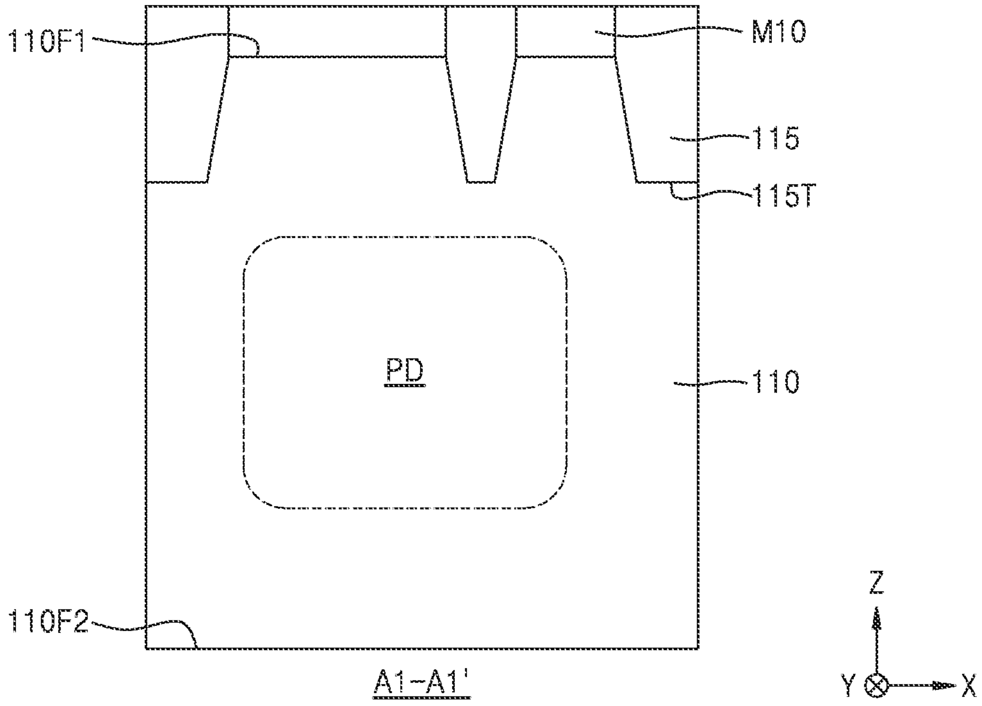

Referring to FIG. 19, an insulating layer (not shown) may be formed in the isolation trench 115T and on the first mask pattern M10, and by planarizing an upper portion of the insulating layer so that an upper surface of the first mask pattern M10 is exposed, the isolation layer 115 may be formed in the isolation trench 115T.

In some implementations, the isolation layer 115 may include a first insulating layer (not shown) conformally formed on an inner wall of the isolation trench 115T, and a second insulating layer (not shown) filling the inside of the isolation trench 115T on the first insulating layer.

In some implementations, unlike FIG. 19, the isolation layer 115 may be disposed on an upper surface of the first mask pattern M10 to cover the upper surface of the first mask pattern M10.

Figure 20:
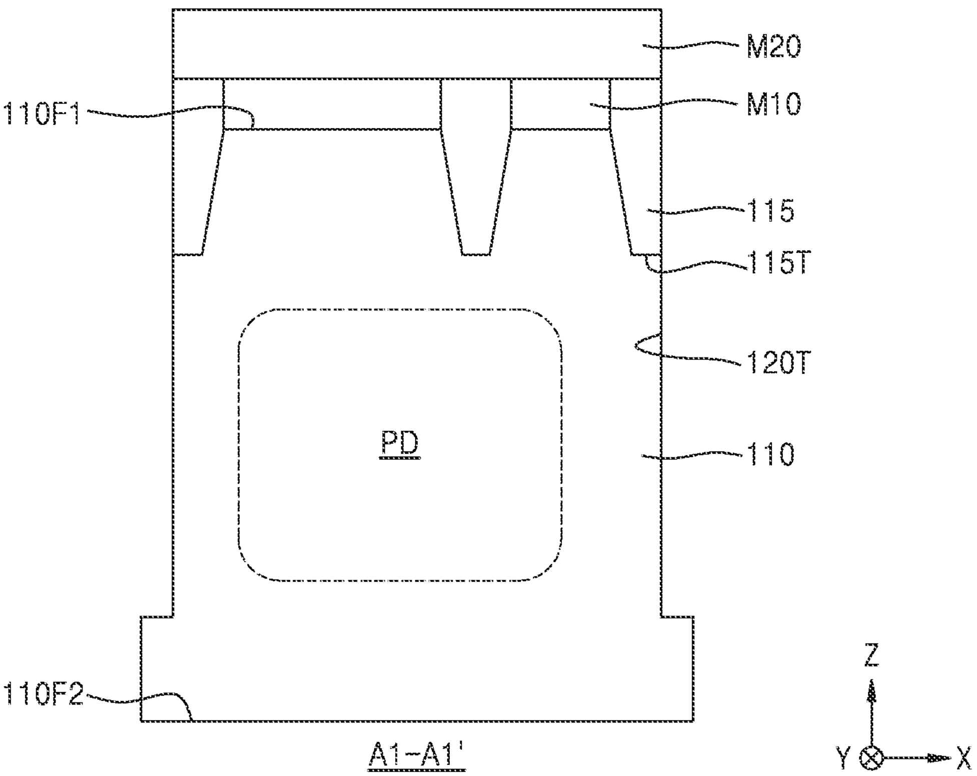

Referring to FIG. 20, a second mask pattern M20 may be formed on the first surface 110F1 of the semiconductor substrate 110, and using the second mask pattern M20 as an etch mask, the pixel trench 120T may be formed in the semiconductor substrate 110. The pixel trench 120T may have a certain depth from the first surface 110F1 of the semiconductor substrate 110, and may be formed in a matrix in a plan view.

Figure 21:
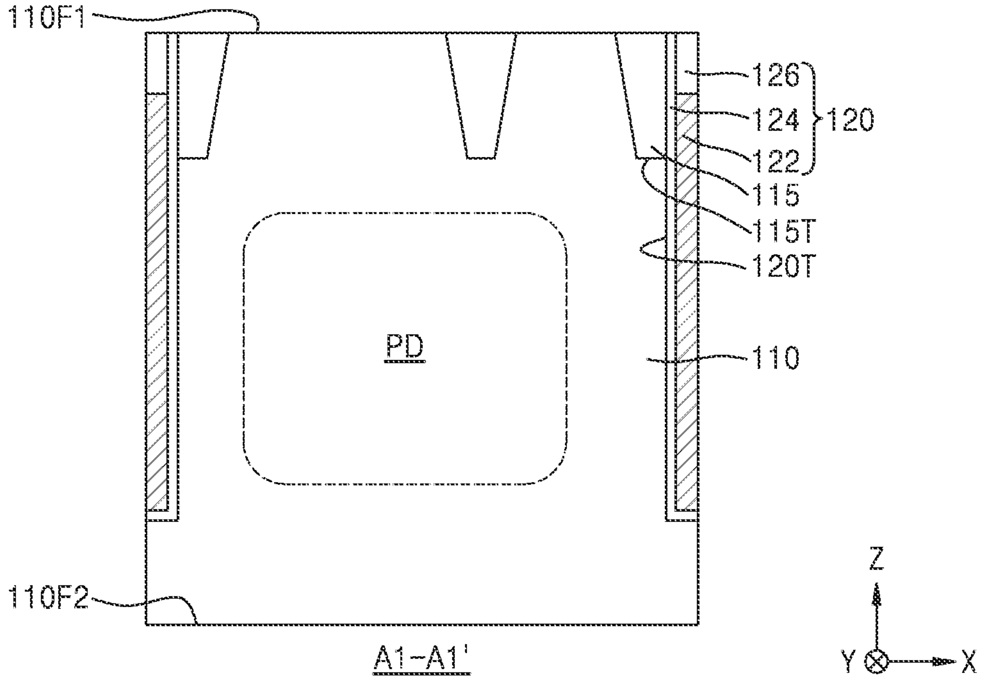

Referring to FIG. 21, the insulating liner 124 may be conformally formed on an inner wall of the pixel trench 120T and the second mask pattern M20 by a chemical vapor deposition (CVD) process and an atomic layer deposition (ALD) process.

Then, the conductive layer 122 filling the inner wall of the pixel trench 120T may be formed on the insulating liner 124, and an upper portion of the conductive layer 122 may be removed by the etch-back process, etc. until an upper surface of the conductive layer 122 reaches a lower vertical level than an upper surface of the first surface 110F1 of the semiconductor substrate 110. The conductive layer 122 may include at least one of, for example; doped polysilicon, a metal, a metal silicide, a metal nitride, and a metal-containing film.

Then, an insulating layer (not shown) may be disposed on the second mask pattern M20 to fill the inlet of the pixel trench 120T, and by removing the insulating layer, the first mask pattern M10, and the second mask pattern M20 until the upper surface of the semiconductor substrate 110 is exposed, the upper insulating layer 126 may be left in the inlet of the pixel trench 120T.

Figure 22A:
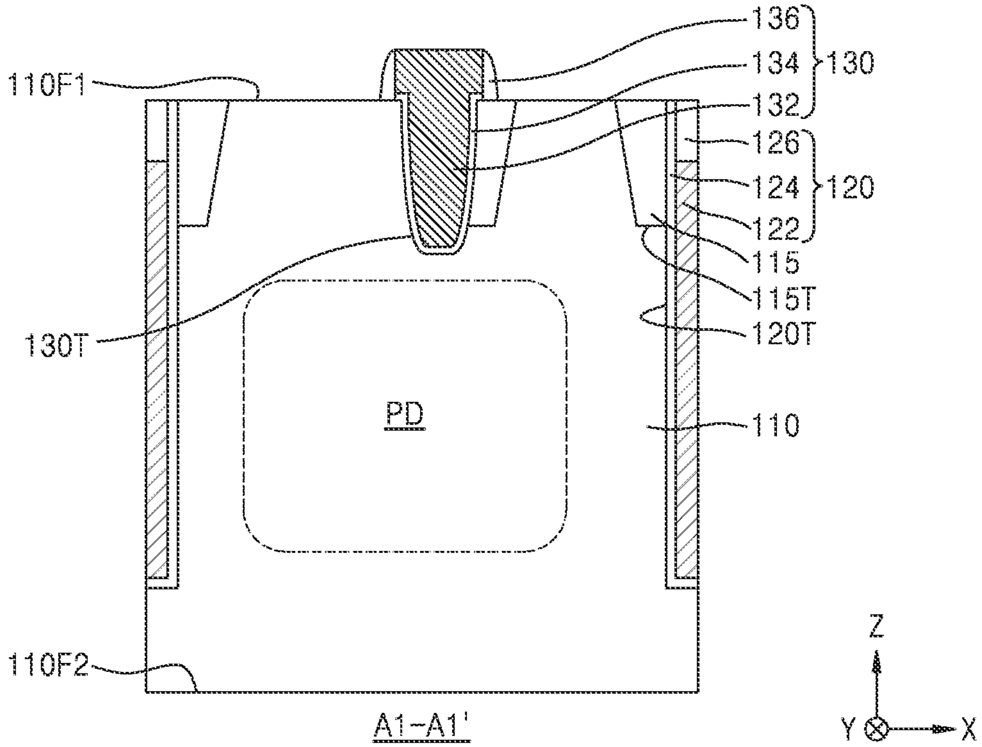
Figure 22B:
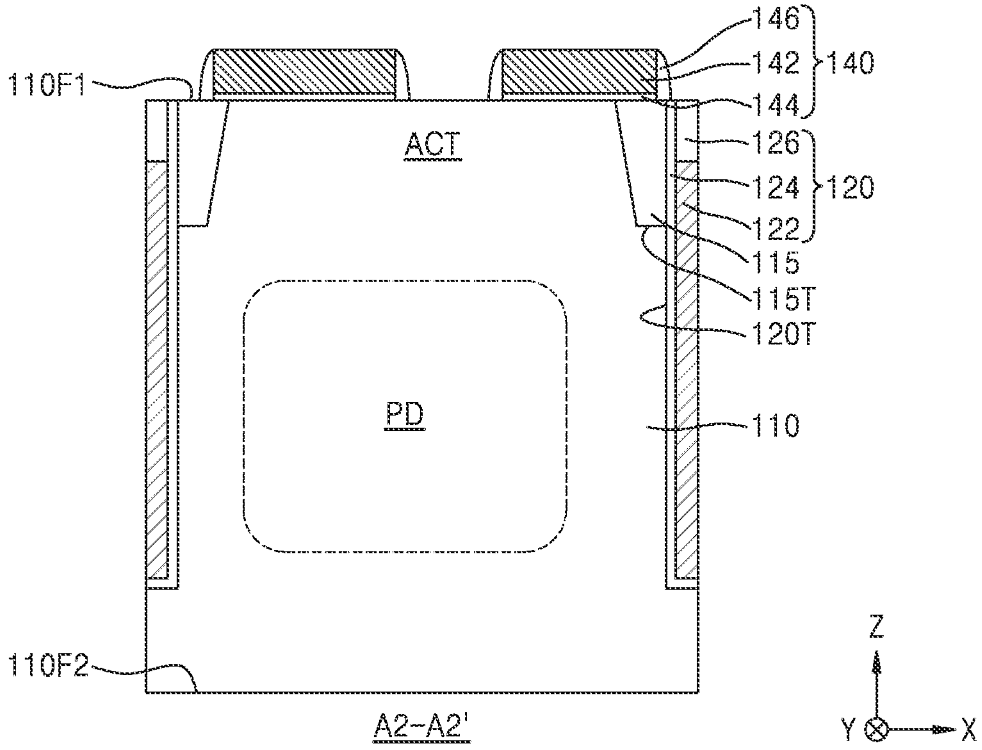

Referring to FIGS. 22A and 22B, a mask pattern (not shown) may be formed on the first surface 110F1 of the semiconductor substrate 110, and partially removing the semiconductor substrate 110 using the mask pattern as an etch mask, the buried gate trench 130T may be formed.

Then, the gate insulating layer 144 and the buried gate insulating layer 134 may be conformally formed on the first surface 110F1 of the semiconductor substrate 110 and an inner wall of the buried gate trench 130T.

A conductive layer (not shown) may be formed on the gate insulating layer 144 and the buried gate insulating layer 134, and by patterning the conductive layer, the planar gate electrode 142 may be formed on the first surface 110F1 of the semiconductor substrate 110, and the buried gate electrode 132 may be formed in the buried gate trench 130T.

In some implementations, the buried gate electrode 132 and the planar gate electrode 142 may be formed by using at least one of, for example, doped polysilicon, a metal, a metal silicide, a metal nitride, and a metal-containing film.

Then, the buried gate spacer 136 and the gate spacer 146 may be formed on a side wall of the buried gate electrode 132 and the planar gate electrode 142. In some implementations, after forming an insulating layer (not shown) to cover the buried gate electrode 132 and the planar gate electrode 142, by performing an anisotropic etching process on the insulating layer, the buried gate spacer 136 and the gate spacer 146 may be formed on the side wall of the buried gate electrode 132 and the planar gate electrode 142, respectively.

Figure 23:
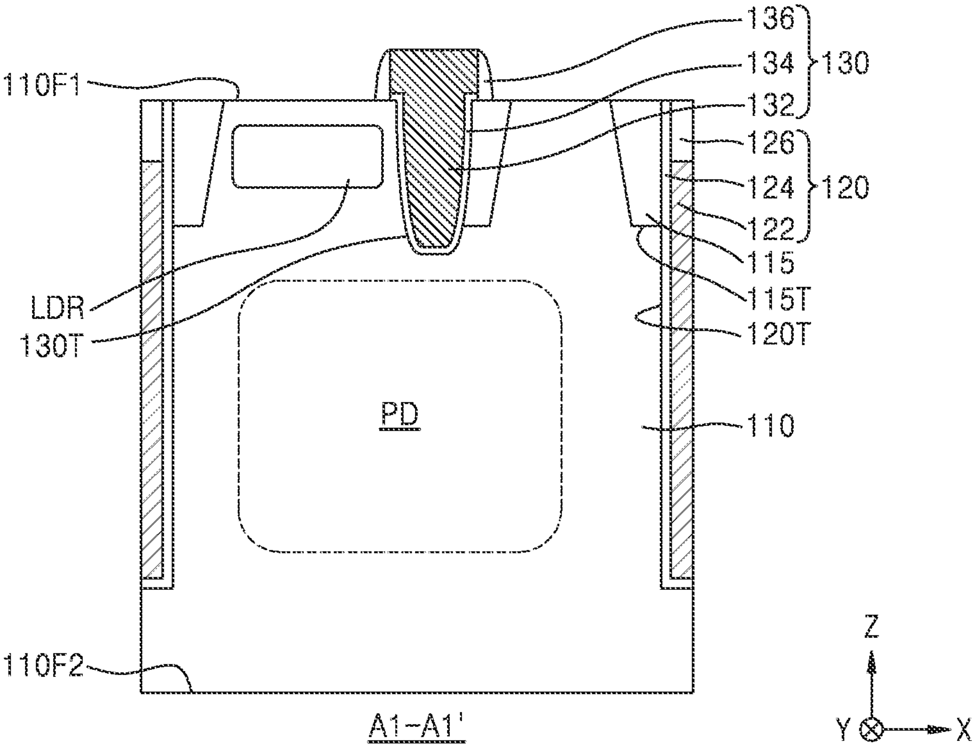

Referring to FIG. 23, by performing the ion implantation process on a portion of the first surface 110F1 of the semiconductor substrate 110, the low-doping region LDR may be formed.

In some implementations, the low-doping region LDR may be formed by injecting the first type of impurity, such as phosphorus and/or arsenic into the semiconductor substrate 110 from the first surface 110F1 of the semiconductor substrate 110 through the ion implantation process.

Here, the first type of impurity may be ion-implanted with a dose that ranges from about 1E11 atom/cm$^2$ to about 1E13 atom/cm$^2$ using energy that ranges from about 10 keV to about 100 keV, but other implementations are possible.

Figure 24:
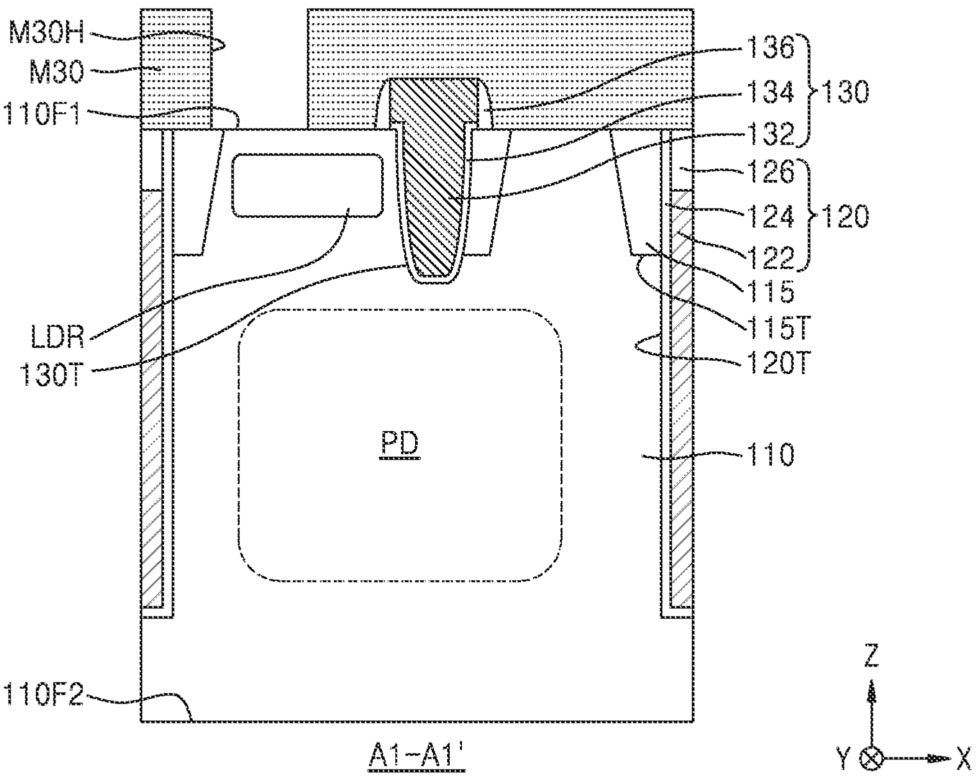

Referring to FIG. 24, an ion implantation mask M30 may be formed on the first surface 110F1 of the semiconductor substrate 110. The ion implantation mask M30 may include an opening M30H, and the opening M30H may be disposed to vertically overlap a portion of the low-doping region LDR.

Figure 25:
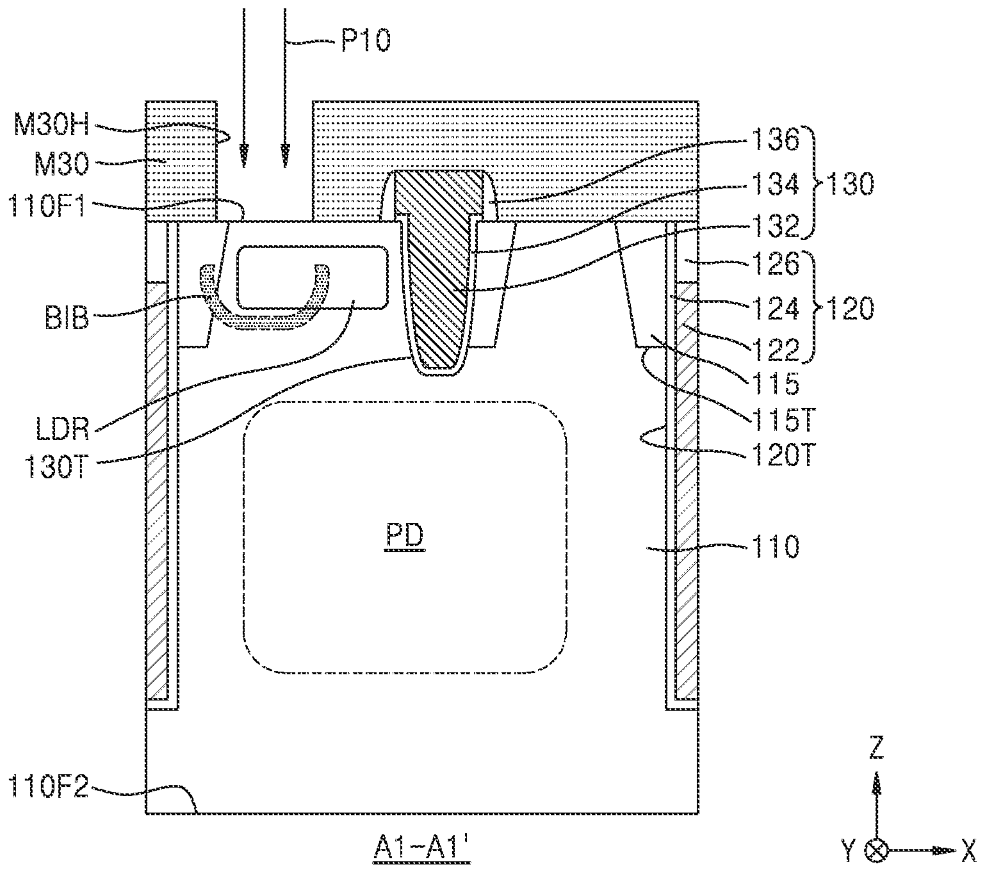

Referring to FIG. 25, the bottom region BIB may be formed by injecting the second type of impurity such as carbon and/or germanium, into the semiconductor substrate 110 using the ion implantation mask M30 through an ion implantation process P10.

In some implementations, the bottom region BIB may be formed by sequentially performing a vertical ion implantation process and an angled or tilted ion implantation process through the first surface 110F1 of the semiconductor substrate 110 exposed by the opening M30H of the ion implantation mask M30. For example, through the vertical ion implantation process, the second type of impurity may be injected to a certain target depth in a direction perpendicular to the first surface 110F1 of the semiconductor substrate 110. Through the angled ion implantation process, the second type of impurity may be injected to a certain target depth in a direction angled with respect to the first surface 110F1 of the semiconductor substrate 110. For example, the target depth may range from about 500 Å to about 1500 Å from the first surface 110F1 of the semiconductor substrate 110, but other implementations are possible.

In some implementations, the second type of impurity may be ion-implanted with a dose ranging from about 1E14 atom/cm$^2$ to about 5E15 atom/cm$^2$ using energy ranging from about 10 keV to about 100 keV, but other implementations are possible. After the ion implantation process, an impurity concentration of the bottom region BIB may range from about 1E19 atom/cm$^3$ to about atom/cm$^3$, but other implementations are possible.

Figure 26:
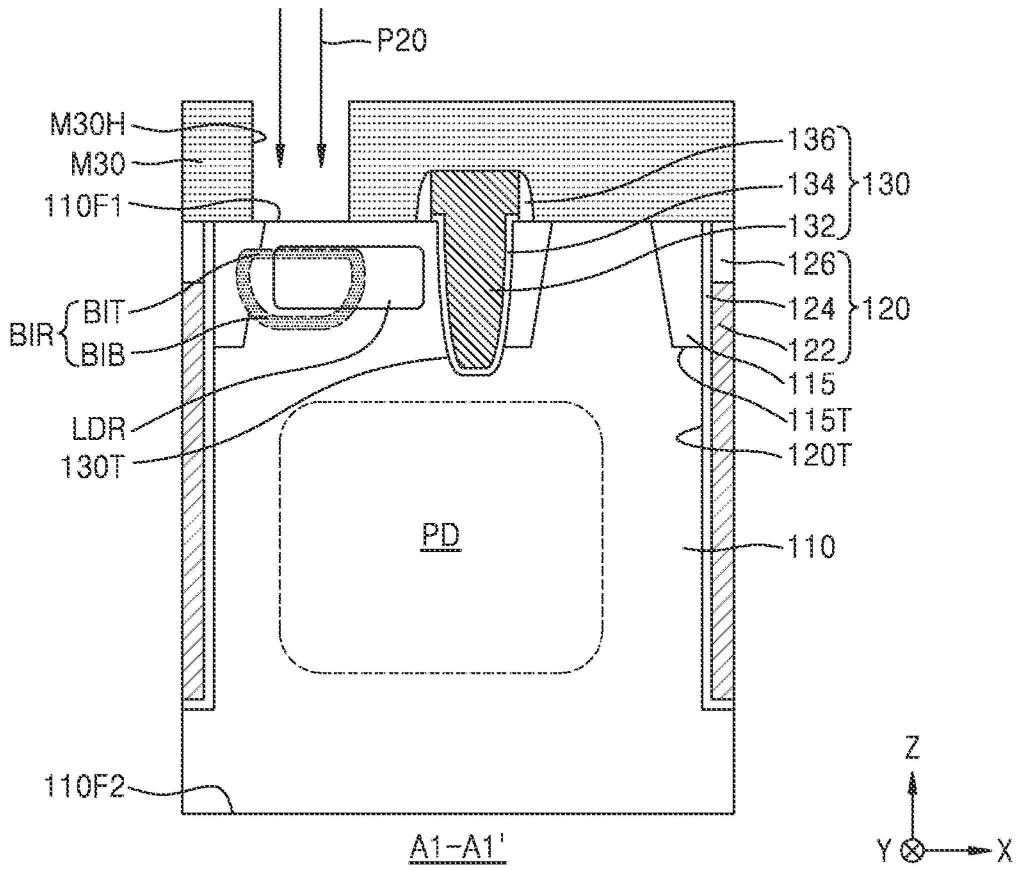

Referring to FIG. 26, the top region BIT may be formed by injecting the second type of impurity into the semiconductor substrate 110 using the ion implantation mask M30 through an ion implantation process P20.

In some implementations, the top region BIT may be formed by ion-implantation of the second type of impurity to a target depth less than a depth of the bottom region BIB through the first surface 110F1 of the semiconductor substrate 110 exposed by the opening M30H of the ion implantation mask M30. For example, the second type of impurity may be ion-implanted with a dose ranging from about 1E14 atom/$cm^2$ to about 5E15 atom/$cm^2$ using energy ranging from about keV to about 100 keV, but other implementations are possible. After the ion implantation process, an impurity concentration of the top region BIT may range from about 1E19 atom/$cm^3$ to about 5E21 atom/$cm^3$, but other implementations are possible.

Figure 27:
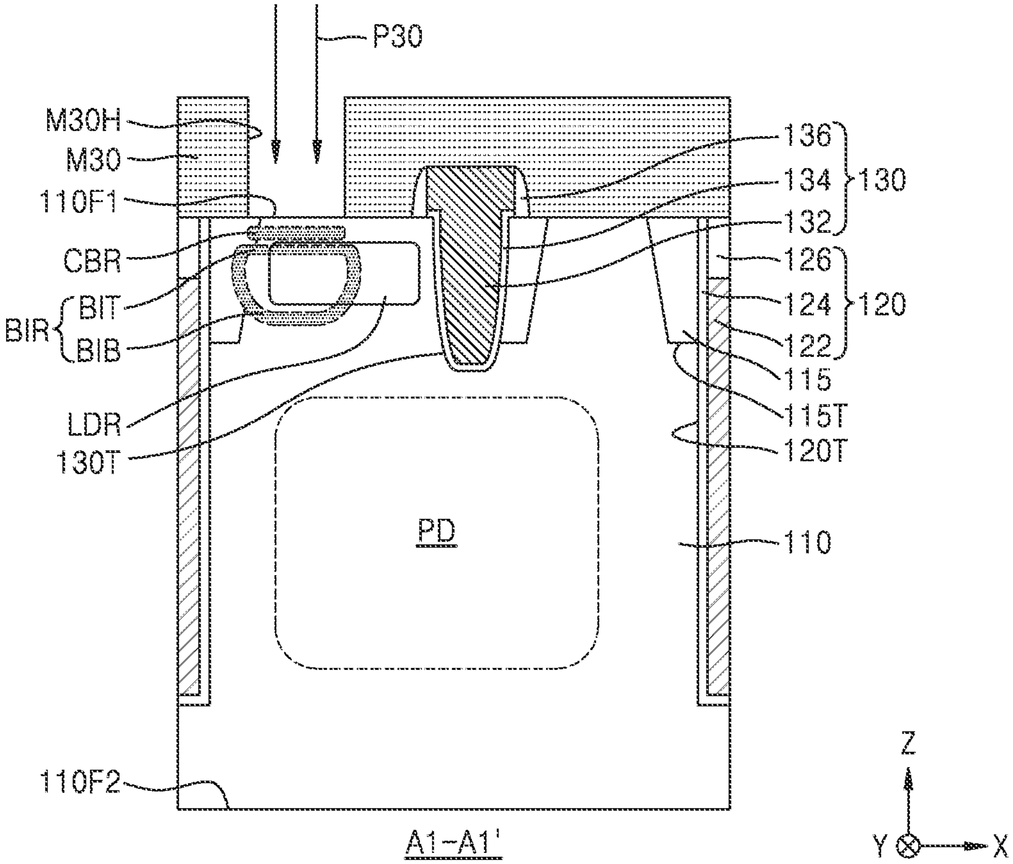

Referring to FIG. 27, the contact barrier region CBR may be formed by injecting the second type of impurity into the semiconductor substrate 110 using the ion implantation mask M30 through an ion implantation process P30.

In some implementations, the contact barrier region CBR may be formed by ion-implantation of the second type of impurity to a target depth less than a depth of the top region BIT through the first surface 110F1 of the semiconductor substrate 110 exposed by the opening M30H of the ion implantation mask M30. For example, the contact barrier region CBR may be formed by ion-implantation of the second type of impurity to a target depth less than or equal to about 500 Å.

The second type of impurity may be ion-implanted with a dose ranging from about 1E14 atom/$cm^2$ to 5E15 atom/$cm^2$ using energy ranging from about 10 keV to about 100 keV, but other implementations are possible. After the ion implantation process, an impurity concentration of the contact barrier region CBR may be about 1E19 atom/$cm^3$ to about 5E21 atom/$cm^3$, however, other implementations are possible.

Figure 28:
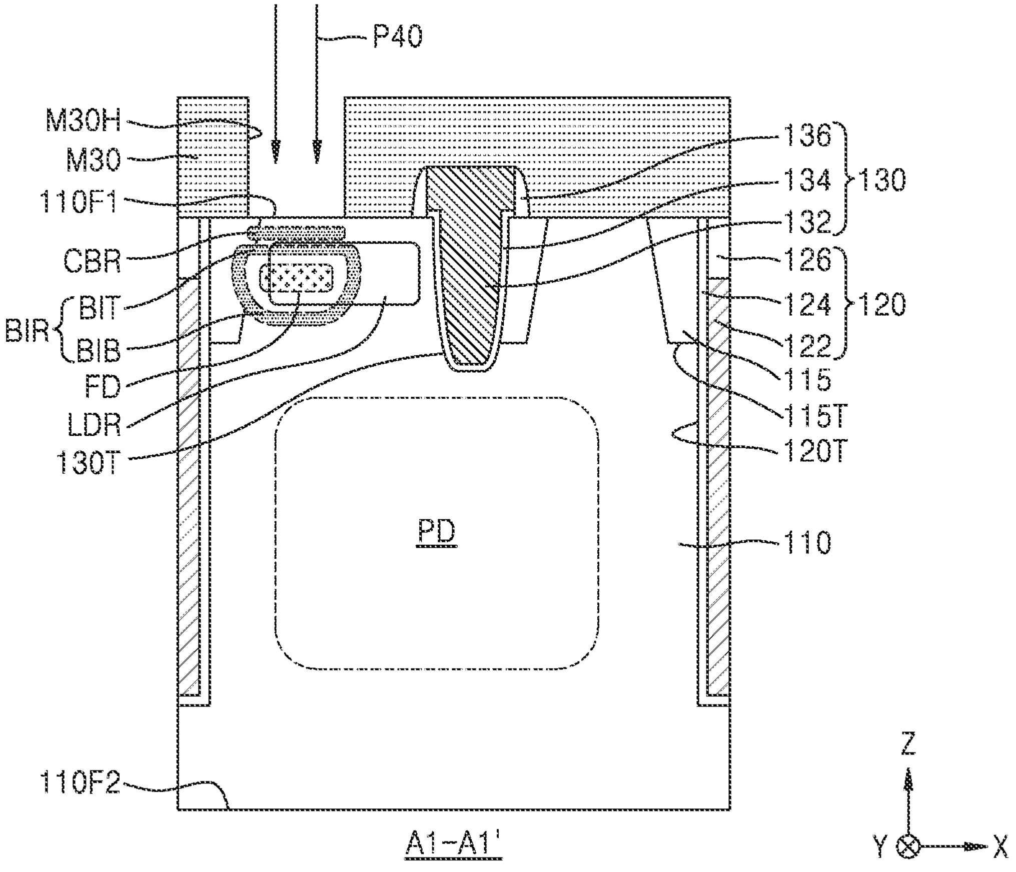

Referring to FIG. 28, the floating diffusion region FD may be formed by injecting the first type of impurity into the semiconductor substrate 110 using the ion implantation mask M30 through an ion implantation process P40. For example, the first type of impurity may be an N-type impurity including phosphorus, arsenic, or a combination thereof.

In some implementations, the floating diffusion region FD may be formed by ion-implantation of the first type of impurity to a target depth greater than the top region BIT and less than a depth of the bottom region BIB through the first surface 110F1 of the semiconductor substrate 110 exposed by the opening M30H of the ion implantation mask M30.

The first type of impurity may be ion-implanted with a dose ranging from about 1E12 atom/$cm^2$ to about 5E14 atom/$cm^2$ using energy ranging from about 10 keV to about 100 keV, but other implementations are possible.

Then, the ion implantation mask M30 may be removed.

Figure 29:
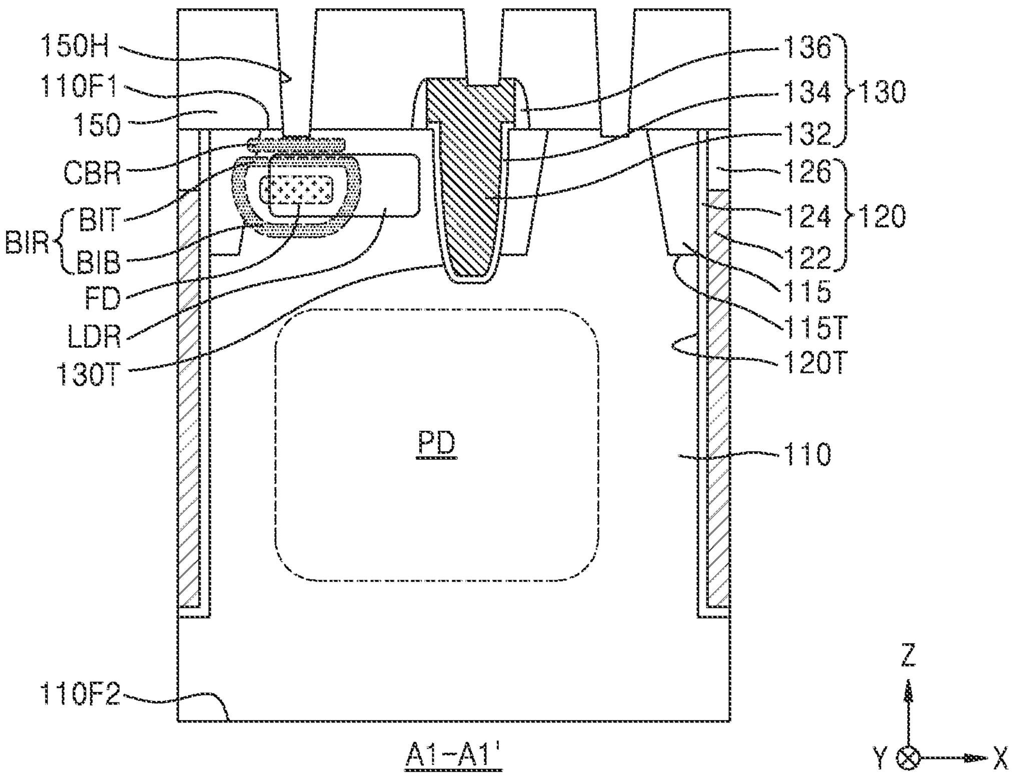

Referring to FIG. 29, the interlayer insulating film 150 may be formed on the first surface 110F1 of the semiconductor substrate 110. In some implementations, the interlayer insulating film 150 may have a height sufficiently great to cover the buried gate structure 130 and the planar gate structure 140.

Here, prior to the formation of the interlayer insulating film 150, an etch stop layer (not shown) may conformally cover the buried gate structure 130 and the planar gate structure 140 may be further formed on the first surface 110F1 of the semiconductor substrate 110.

Then, a mask pattern (not shown) may be formed on the interlayer insulating film 150, and using the mask pattern as an etch mask, the contact hole 150H passing through the interlayer insulating film 150 may be formed.

In some implementations, a bottom portion of the contact hole 150H may expose the first surface 110F1 of the semiconductor substrate 110 or an upper surface of the buried gate structure 130 and the planar gate structure 140.

Figure 30:
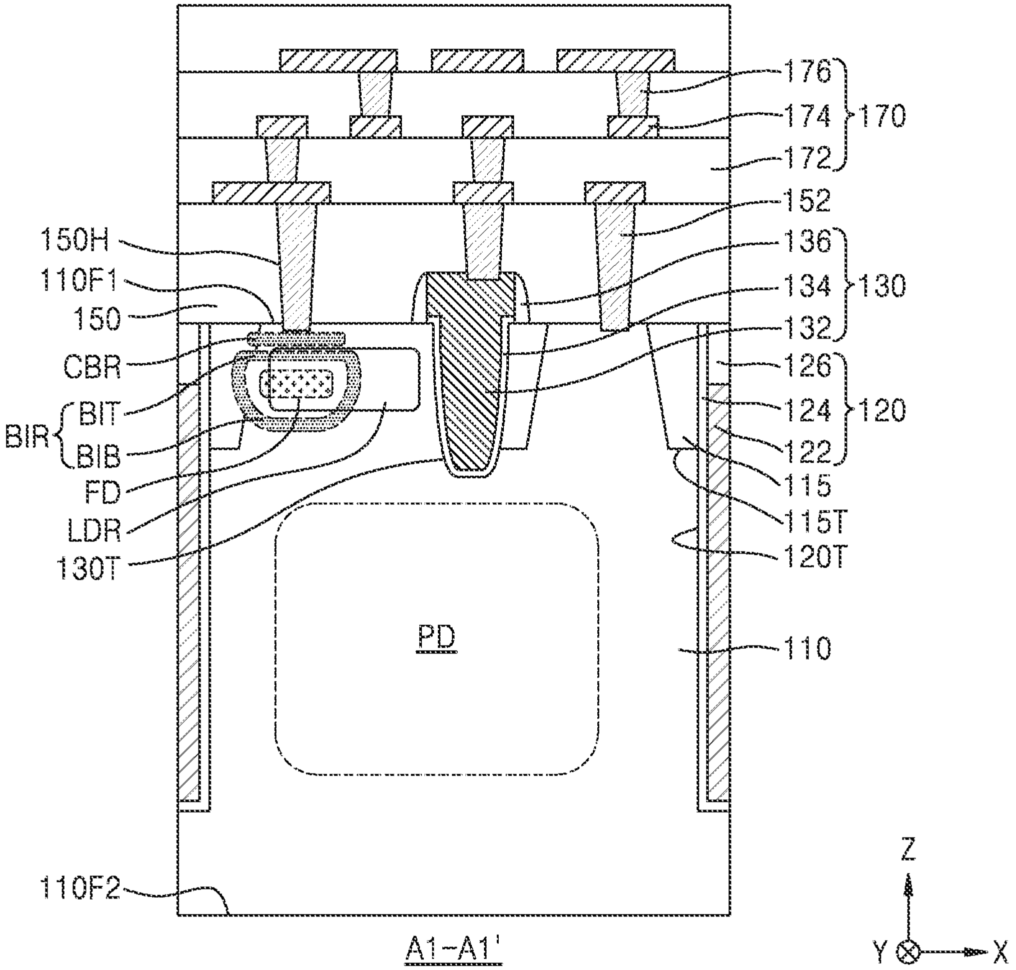

With respect to FIG. 30, a conductive layer (not shown) filling the contact hole 150H may be formed on the interlayer insulating film 150, and by planarizing an upper surface of the conductive layer until an upper surface of the interlayer insulating film 150 is exposed, the contact 152 may be formed in the contact hole 150H.

Then, by repeatedly performing operations of forming a conductive layer (not shown) on the interlayer insulating film 150, patterning the conductive layer, and forming an insulating layer (not shown) to cover the patterned conductive layer, the upper wiring structure 170 including the insulating layer 172, the wiring layer 174, and the via contact 176 may be formed.

Figure 31:
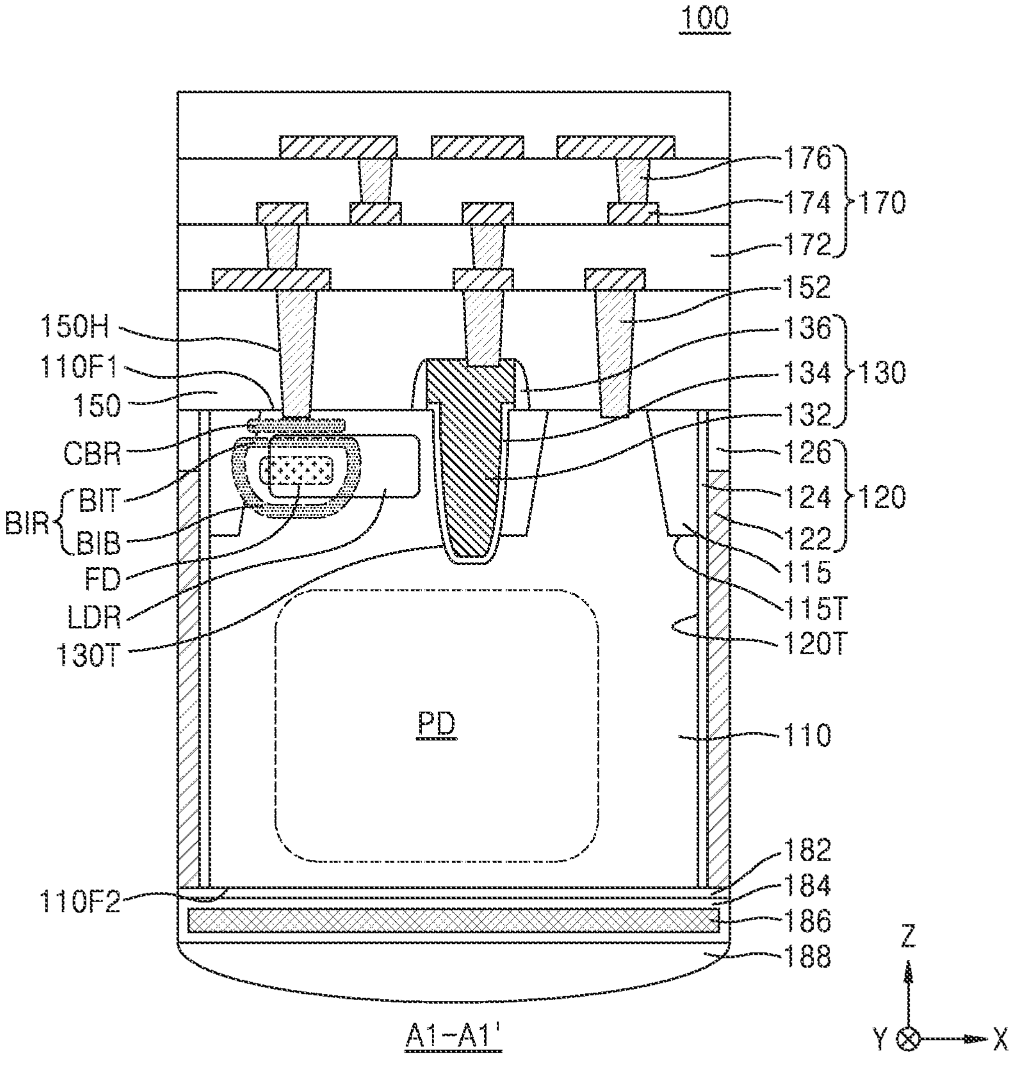

Referring to FIG. 31, a support substrate (not shown) may be attached onto the first surface 110F1 of the semiconductor substrate 110, and the semiconductor substrate 110 may be overturned so that the second surface 110F2 of the semiconductor substrate 110 may face upwards.

Then, a portion of the semiconductor substrate 110 may be removed from the second surface 110F2 of the semiconductor substrate 110 by performing a planarization process, such as a chemical mechanical polishing (CMP) process, an etch-back process, etc., until an upper surface of the pixel separation structure 120, e.g., an end portion adjacent to the second surface 110F2 of the semiconductor substrate 110, is exposed. As the planarization process is performed, a level of the second surface 110F2 of the semiconductor substrate 110 may be reduced.

Then, the rear insulating layer 182 may be formed on the second surface 110F2 of the semiconductor substrate 110. The rear insulating layer 182 may cover the pixel separation structure 120, and may be formed on an entire area of the second surface 110F2 of the semiconductor substrate 110.

Then, the passivation layer 184 may be formed on the rear insulating layer 182, and the color filter 186 and the microlens 188 may be formed on the passivation layer 184.

In relation to various comparative examples, the transfer gate TG, e.g., the buried gate structure 130, may transmit charge generated at the photoelectric conversion region PD to the floating diffusion region FD, the floating diffusion region FD may accumulate (or store) charge, and the drive transistor DX may be controlled in accordance with an amount of photo-charge accumulated in the floating diffusion region FD. However, as the size of pixels of the image sensor decrease, a distance between the transfer gate TG and the floating diffusion region FD may be reduced. Accordingly, impurity atoms associated with the floating diffusion region FD may migrate or diffuse into the semiconductor substrate 110 under the influence, for example, of a heat treatment process performed after the ion implantation process. Accordingly, a gate-induced drain leakage (GIDL) type leakage current may occur and optical properties of the image sensor may be degraded.

In contrast, in relation to embodiments of the inventive concept, the barrier impurity region BIR may be formed by injecting impurities, such as carbon and/or germanium around the floating diffusion region FD through the ion implantation process, and the contact barrier region CBR may be formed by injecting the impurities, such as carbon and/or germanium between the floating diffusion region FD and the contact 152 through the ion implantation process. Hence, the contact barrier region CBR and the barrier impurity region BIR may function as a barrier that suppresses or prevents migration or diffusion of impurities due to variations in the ion implantation process and/or caused by a later-applied heat treatment process. In this manner, leakage current for image sensors according to embodiments of the inventive concept may be markedly reduced or eliminated.

Figure 32:
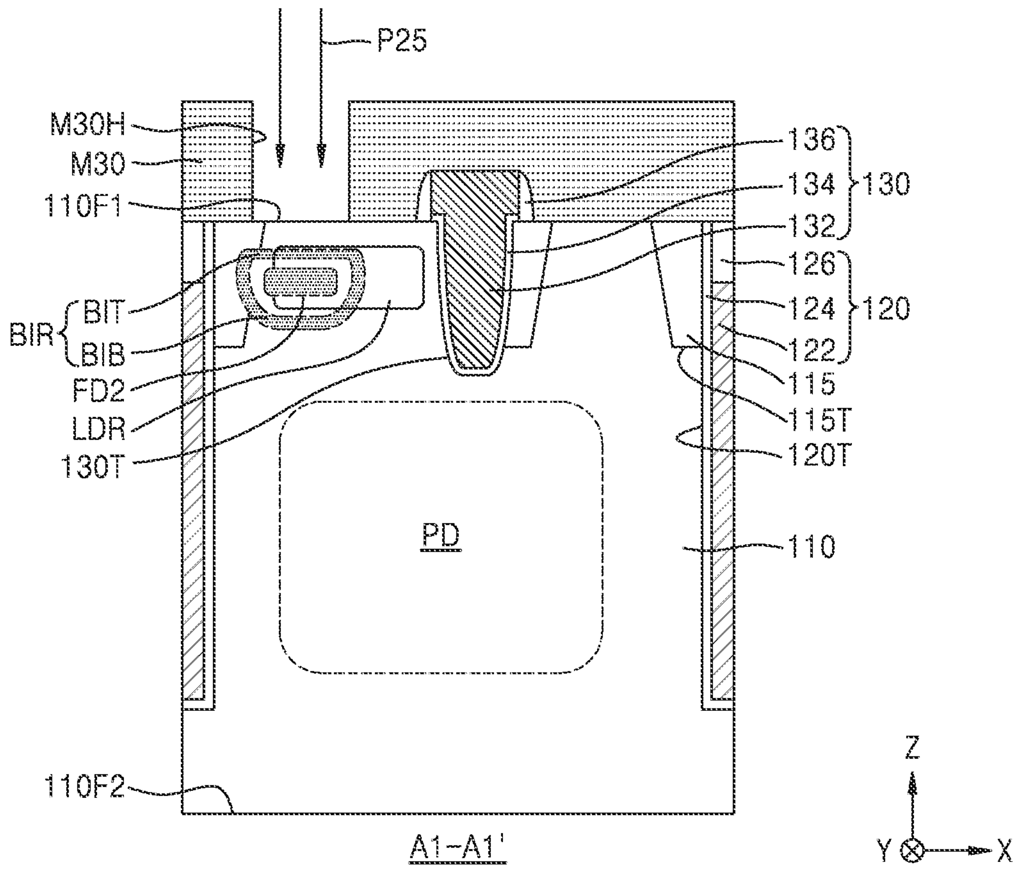
FIGS. 32 to 34 are cross-sectional views illustrating an example of a method of manufacture for an image sensor.
Figure 33:
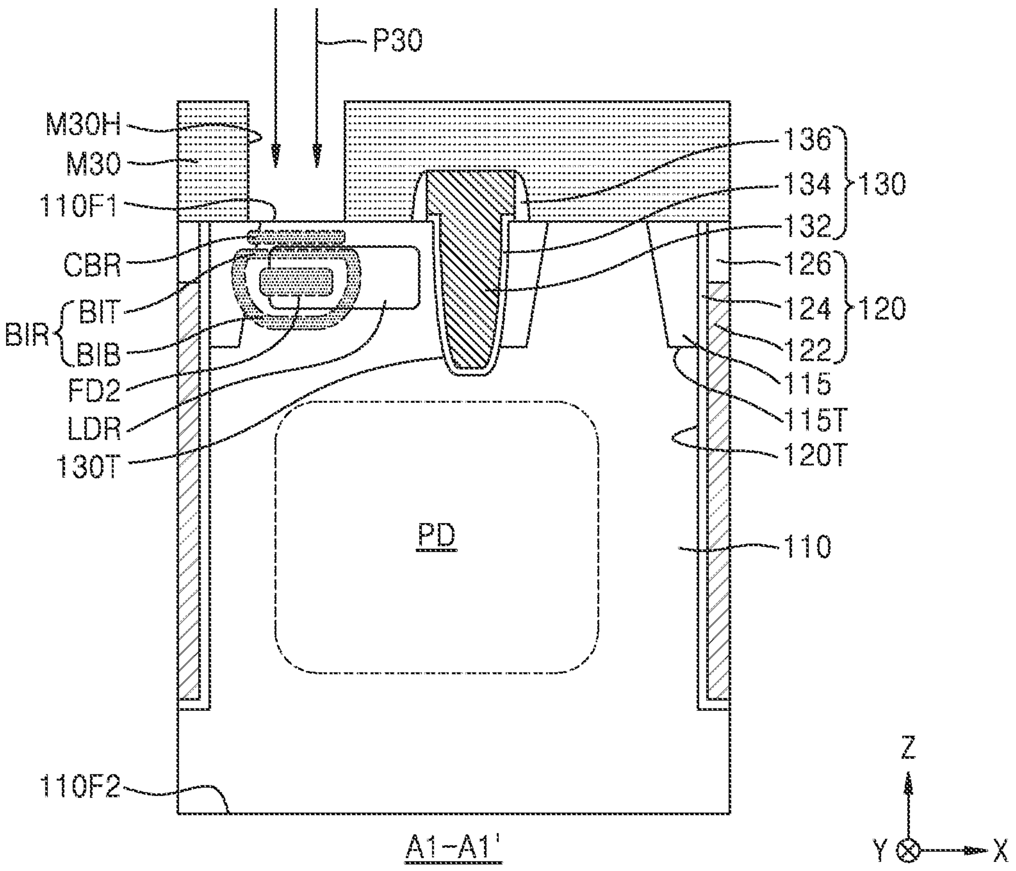
Figure 34:
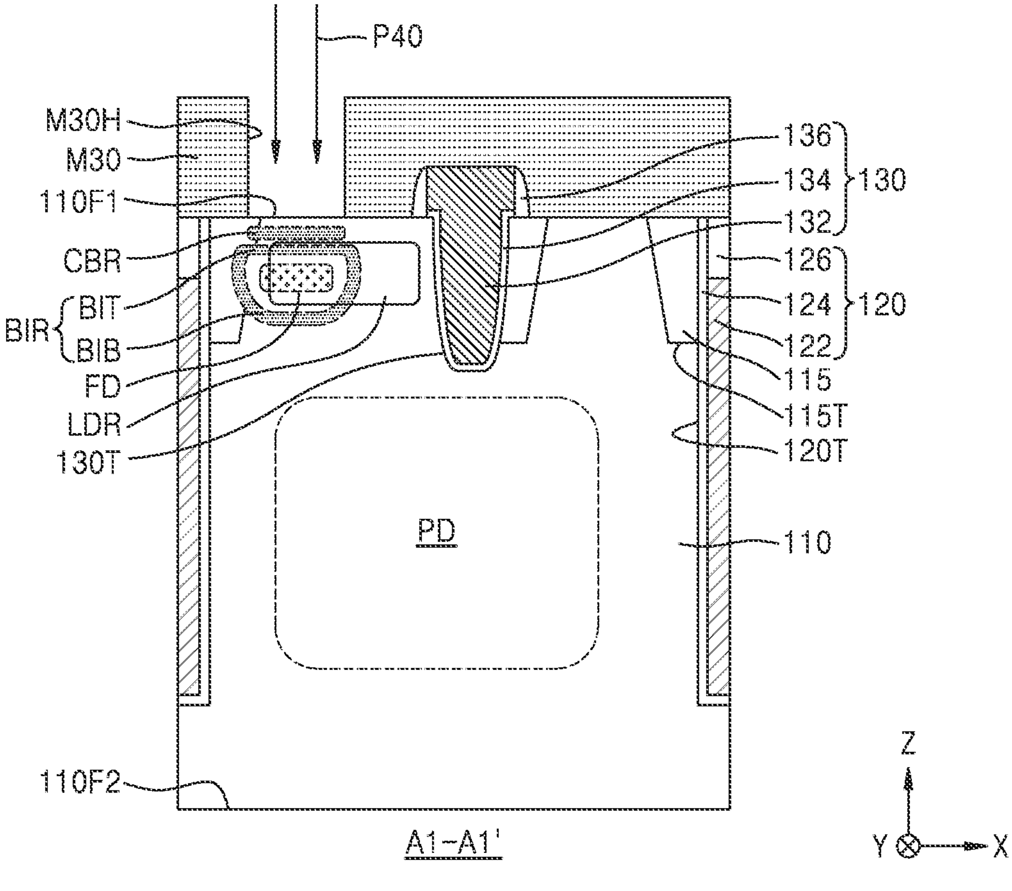

FIGS. 32 to 34 are cross-sectional views illustrating an example of a method of manufacture for the image sensor 100A of FIG. 7.

First, the processes described in relation to FIGS. 17 to 26 are performed to form a structure including the bottom region BIB and the top region BIT of the semiconductor substrate 110.

Referring to FIG. 32, the second type of impurity region FD2 may be formed by injecting the second type of impurity into the semiconductor substrate 110 using the ion implantation mask M30 through an ion implantation process P25.

In some implementations, the second type of impurity region FD2 may be formed by ion-implantation of the second type of impurity to a target depth greater than the top region BIT and less than a depth of the bottom region BIB through the first surface 110F1 of the semiconductor substrate 110 exposed by the opening M30H of the ion implantation mask M30.

Referring to FIG. 33, the contact barrier region CBR may be formed by injecting the second type of impurity into the semiconductor substrate 110 using the ion implantation mask M30 through an ion implantation process P30.

Referring to FIG. 34, the first type of impurity region FD1 may be formed by injecting the first type of impurity into the semiconductor substrate 110 using the ion implantation mask M30 through the ion implantation process P40.

In some implementations, the first type of impurity region FD1 may be formed by ion-implantation of the first type of impurity to a target depth greater than the top region BIT and less than a depth of the bottom region BIB through the first surface 110F1 of the semiconductor substrate 110 exposed by the opening M30H of the ion implantation mask M30.

For example, the first type of impurity region FD1 may be formed to overlap the second type of impurity region FD2, and accordingly, the floating diffusion region FD (see FIG. 7) including the first type of impurity region FD1 and the second type of impurity region FD2 may be obtained.

Thereafter, by performing the processes described in relation to FIGS. 29 to 31, the image sensor 100A may be completed.

FIGS. 35 to 39 are cross-sectional views illustrating an example of a method of manufacture for image sensor 100B of FIG. 7.

First, the processes described in relation to FIGS. 17 to 23 are performed to form a structure including the buried gate structure 130 and the low-doping region LDR.

Figure 35:
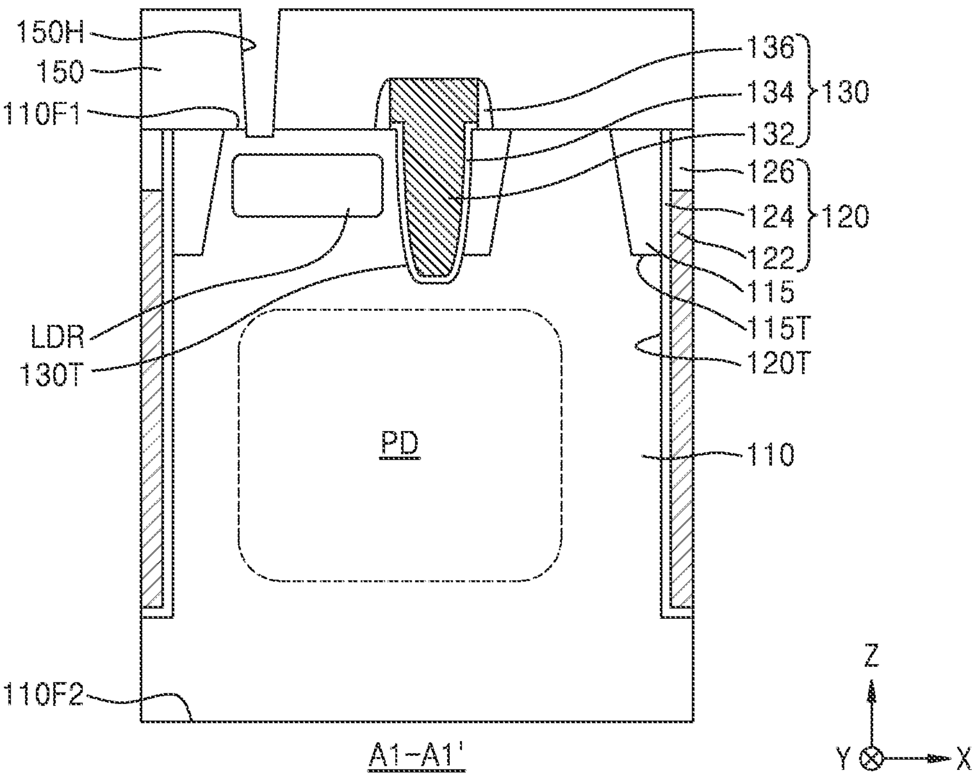
FIGS. 35 to 39 are cross-sectional views illustrating an example of a method of manufacture for an image sensor.

Referring to FIG. 35, the interlayer insulating film 150 may be formed on the first surface 110F1 of the semiconductor substrate 110. In some implementations, the interlayer insulating film 150 may have a height greater enough to cover the buried gate structure 130 and the planar gate structure 140.

Then, a mask pattern (not shown) may be formed on the interlayer insulating film 150, and using the mask pattern as an etch mask, the contact hole 150H passing through the interlayer insulating film 150 may be formed.

In some implementations, a bottom portion of the contact hole 150H may partially expose the first surface 110F1 of the semiconductor substrate 110 overlapping a position in which the floating diffusion region FD is to be formed.

Figure 36:
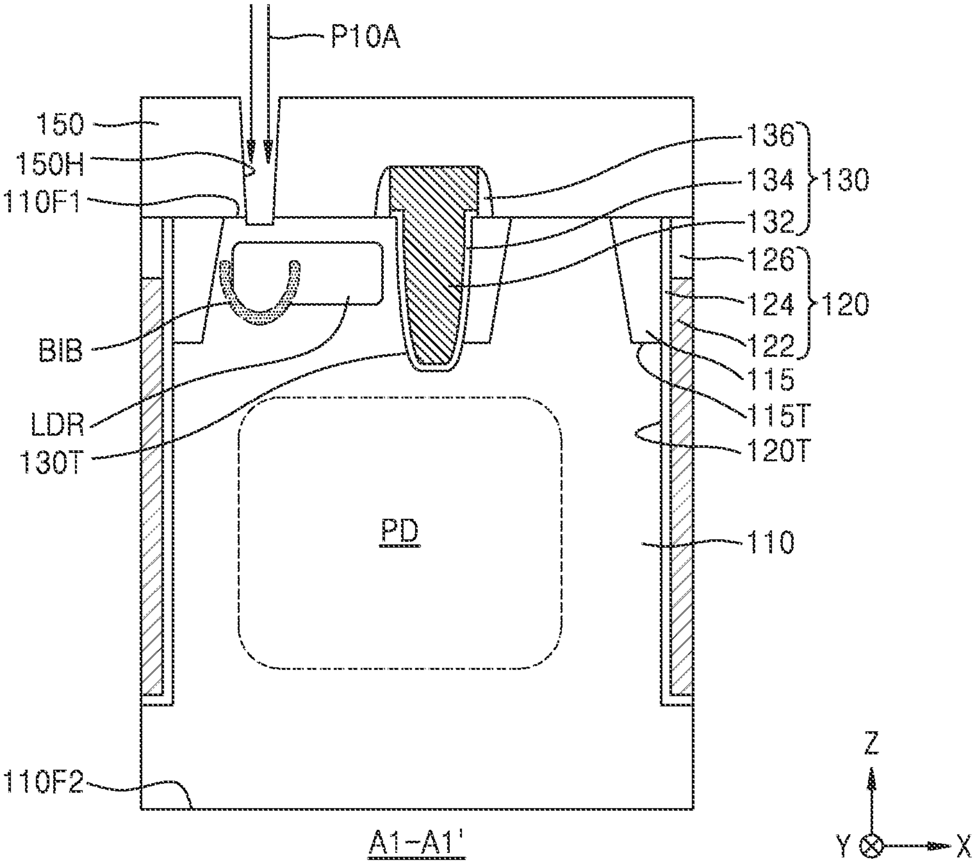

Referring to FIG. 36, the bottom region BIB may be formed by injecting the second type of impurity through the first surface 110F1 of the semiconductor substrate 110 exposed at the bottom portion of the contact hole 150H according to an ion implantation process P10A.

In some implementations, the bottom region BIB may be formed by sequentially performing a vertical ion implantation process and an angled ion implantation process through the first surface 110F1 of the semiconductor substrate 110 exposed by the bottom portion of the contact hole 150H.

Figure 37:
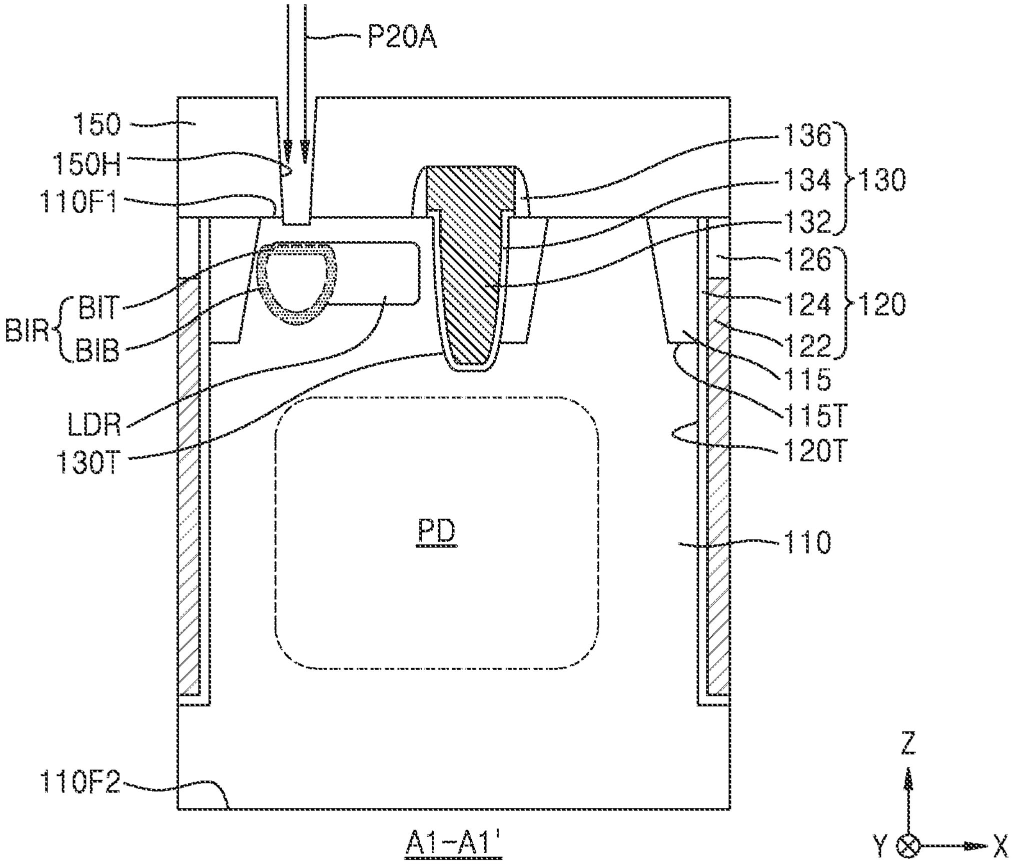

Referring to FIG. 37, the top region BIT may be formed by injecting the second type of impurity through the first surface 110F1 of the semiconductor substrate 110 exposed at the bottom portion of the contact hole 150H according to an ion implantation process P20A.

In some implementations, the top region BIT may be formed by ion-implantation of the second type of impurity to a target depth less than a depth of the bottom region BIB through the first surface 110F1 of the semiconductor substrate 110 exposed by the bottom portion of the contact hole 150H.

Figure 38:
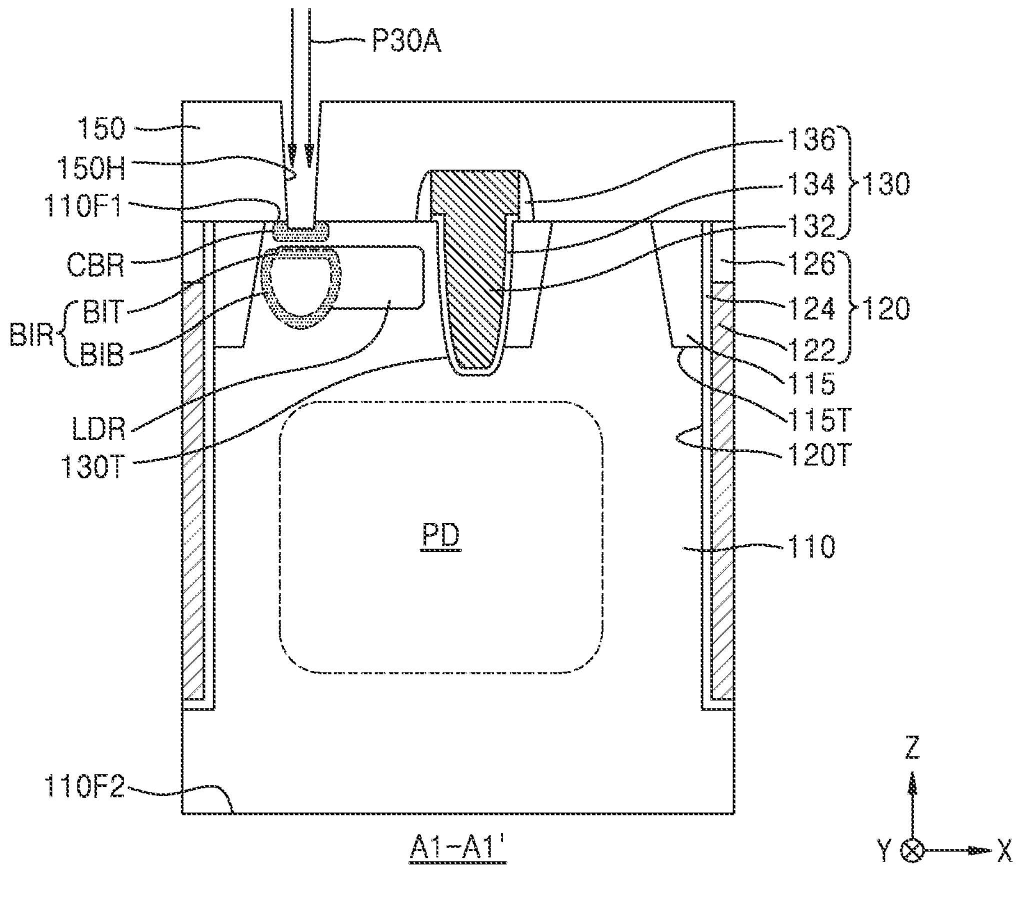

Referring to FIG. 38, the contact barrier region CBR may be formed by injecting the second type of impurity through the first surface 110F1 of the semiconductor substrate 110 exposed at the bottom portion of the contact hole 150H according to an ion implantation process P30A.

In some implementations, the contact barrier region CBR may be formed by ion-implantation of the second type of impurity to a target depth less than a depth of the top region BIT through the first surface 110F1 of the semiconductor substrate 110 exposed by the bottom portion of the contact hole 150H.

Figure 39:
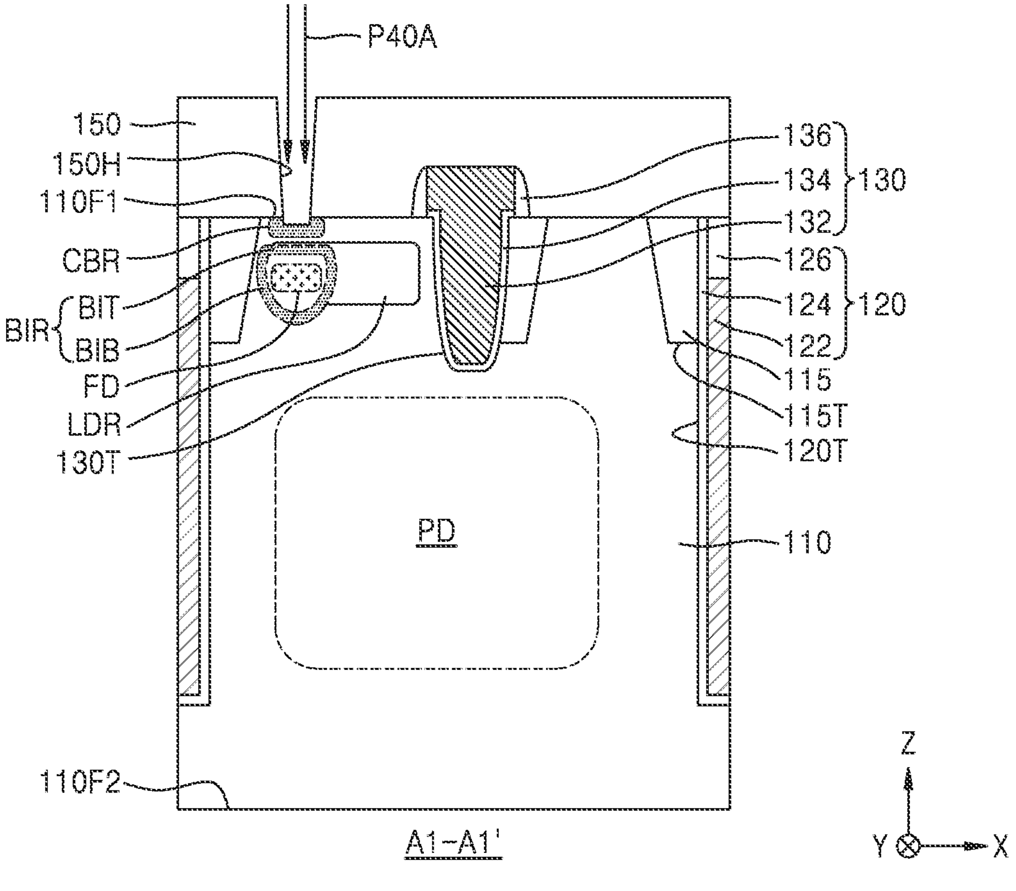

Referring to FIG. 39, the floating diffusion region FD may be formed by injecting the first type of impurity through the first surface 110F1 of the semiconductor substrate 110 exposed at the bottom portion of the contact hole 150H according to an ion implantation process P40A.

In some implementations, the floating diffusion region FD may be formed by ion-implantation of the first type of impurity to a target depth greater than the top region BIT and less than a depth of the bottom region BIB through the first surface 110F1 of the semiconductor substrate 110 exposed by the bottom portion of the contact hole 150H.

Thereafter, by performing the processes described in relation to FIGS. 30 and 31, the image sensor 100B may be completed.

FIGS. 40 to 44 are cross-sectional views illustrating an example of a method of manufacture for the image sensor 200.

First, the processes described in relation to FIGS. 17 to 23 are performed to form a structure including the buried gate structure 130 and the low-doping region LDR.

Figure 40:
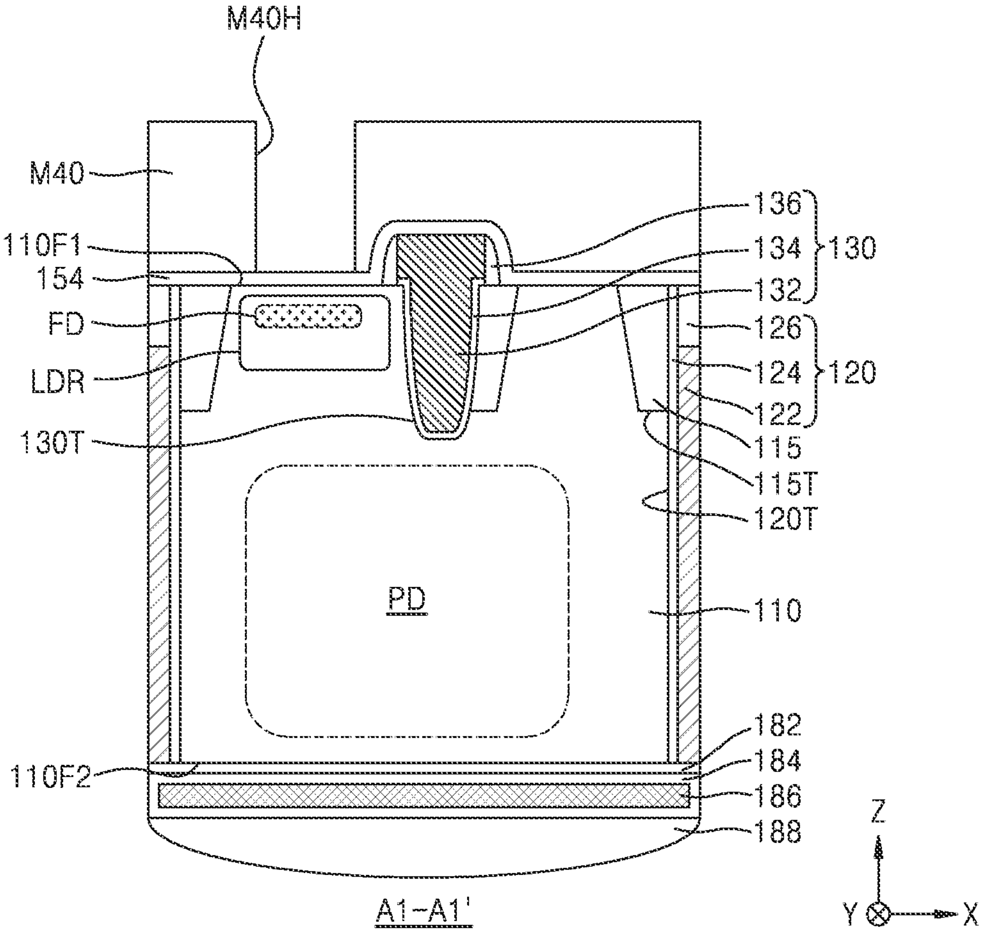
FIGS. 40 to 44 are cross-sectional views illustrating an example of a method of manufacture for an image sensor.

Referring to FIG. 40, the etch stop layer 154 covering the buried gate structure 130 and the planar gate structure 140 may be formed on the first surface 110F1 of the semiconductor substrate 110. Then, a first mask layer M40 including a first opening M40H may be formed on the etch stop layer 154.

Figure 41:
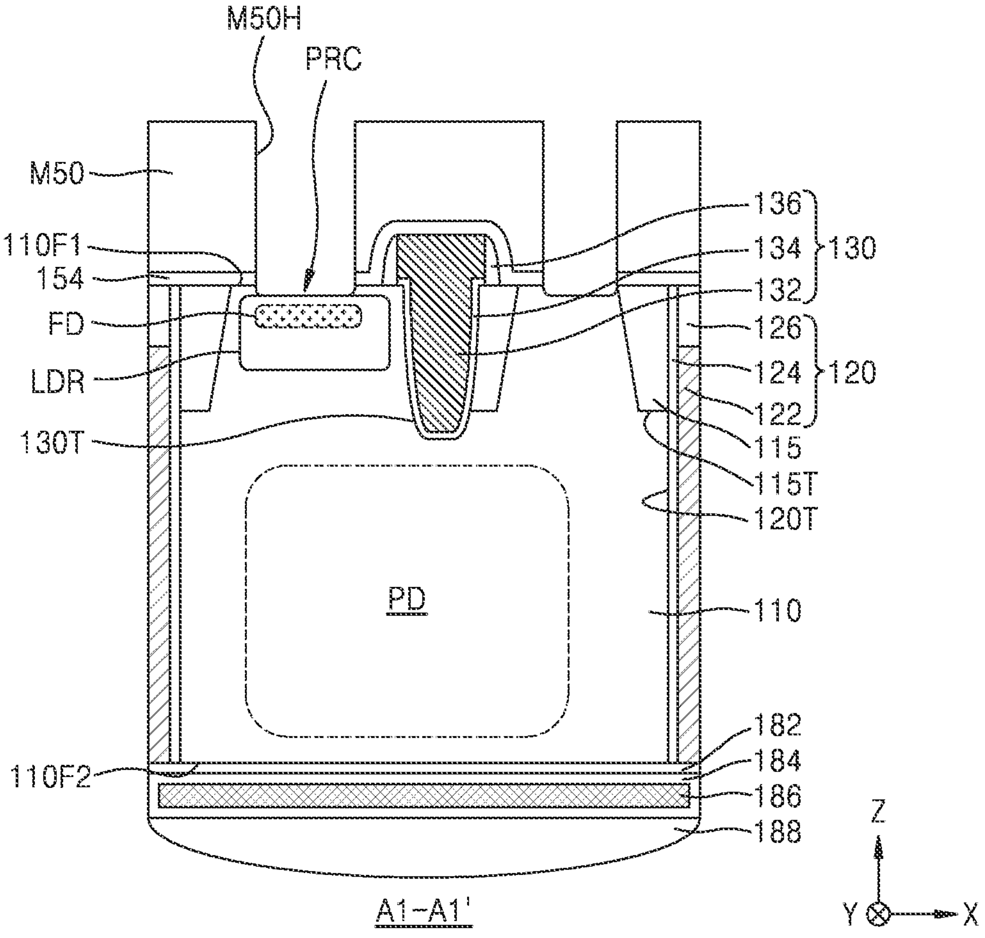

In some implementations, the floating diffusion region FD may be formed by implanting impurity ions into the semiconductor substrate 110 exposed through the first opening M40H. In some implementations, by implanting the gettering atom including carbon or germanium into the semiconductor substrate 110 exposed through the first opening M40H, the barrier impurity region may be formed on the floating diffusion region FD or under the floating diffusion region FD. Referring to FIG. 41, the first mask layer M40 may be removed.

Then, a second mask layer M50 including a second opening M50H may be formed on the etch stop layer 154.

A portion of the etch stop layer 154 exposed through the second opening M50H on the first surface 110F1 of the semiconductor substrate 110 and a portion of an upper side of the semiconductor substrate 110 may be removed. For example, a portion of the etch stop layer 154 uncovered by the second mask layer M50 and a portion of the upper side of the semiconductor substrate 110 may be removed. By removing a portion of the upper side of the semiconductor substrate 110, the pad recess PRC may be formed.

Then, the second mask layer M50 may be removed.

Figure 42:
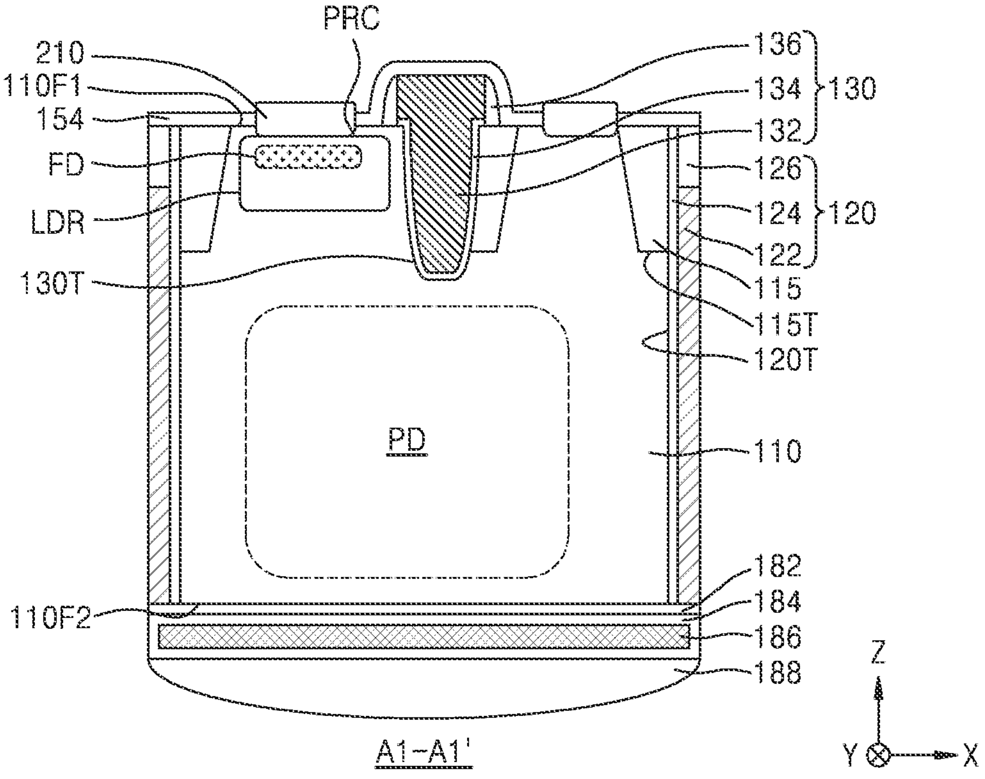

Referring to FIG. 42, the contact pad 210 may be formed in the pad recess PRC by using polysilicon. In some implementations, the contact pad 210 may be formed to have a relatively great thickness to fill the pad recess PRC and have an upper surface disposed at a higher level than the upper surface of the semiconductor substrate 110. In some implementations, the contact pad 210 may be formed to have an upper surface disposed at a higher level than an upper surface of the etch stop layer 154.

In some implementations, in the process of forming the contact pad 210, an N-type impurity such as phosphorus or arsenic may be used for doping as well. In some implementations, after forming the contact pad 210, an N-type impurity such as phosphorus or arsenic may be injected into the contact pad 210 by the ion-implantation process.

In some implementations, in the process of forming the contact pad 210, a gettering atom including carbon or germanium may be used for doping as well. In some implementations, after forming the contact pad 210, a gettering atom including carbon or germanium may be injected into the contact pad 210 by the ion-implantation process.

Figure 43:
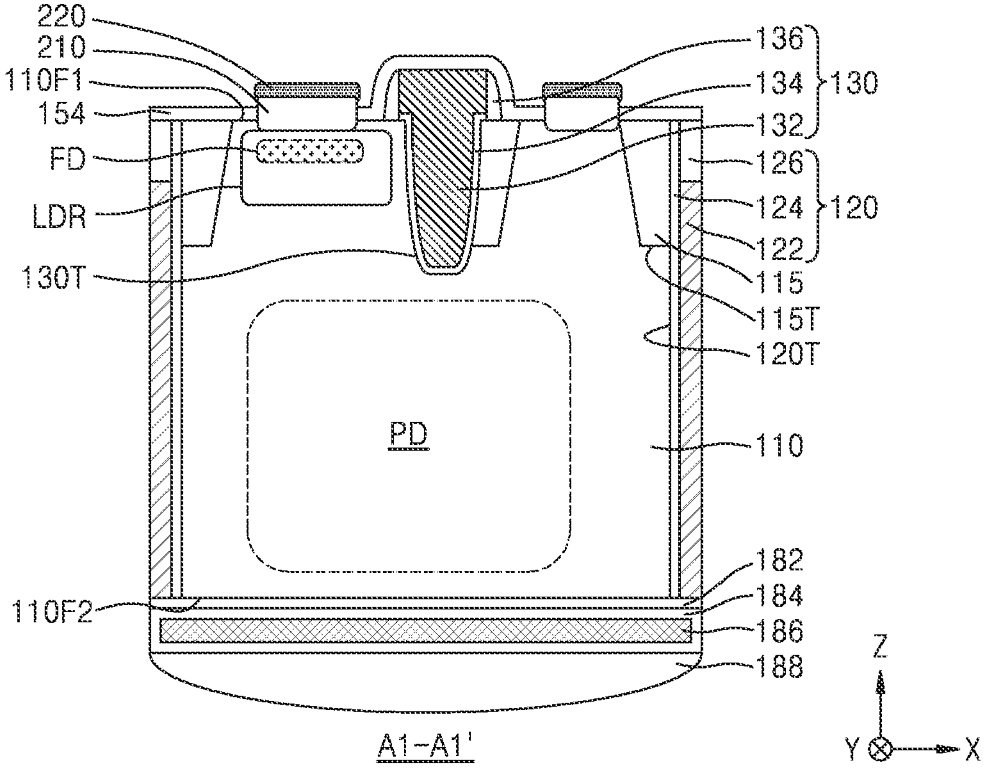

Referring to FIG. 43, the intermediate layer 220 may be formed on the contact pad 210. The intermediate layer 220 may be formed by using a metal silicide such as a tungsten silicide, a nickel silicide, a cobalt silicide, a titanium silicide, etc. In some implementations, the intermediate layer 220 may be formed by a method of forming a metal silicide through self alignment. For example, the intermediate layer 220 may be optionally formed on the contact pad 210 instead of on the etch stop layer 154.

Figure 44:
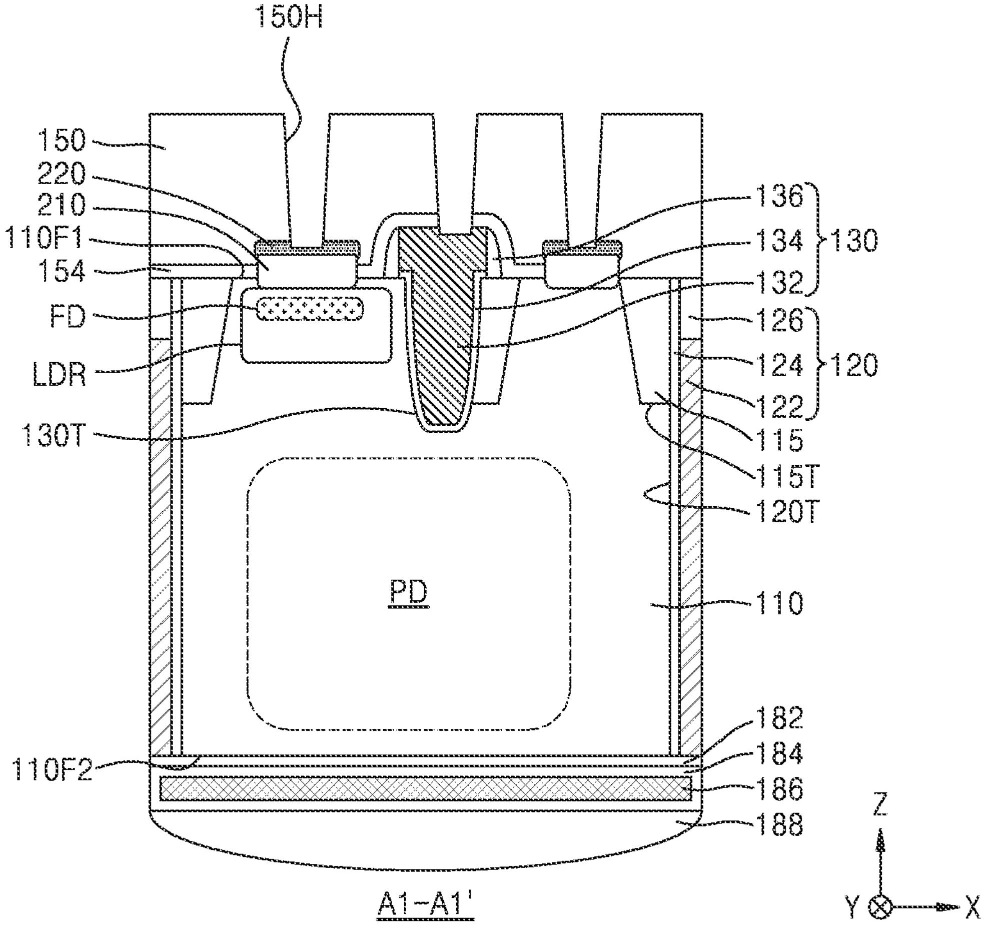

Referring to FIG. 44, the interlayer insulating film 150 may be formed on the first surface 110F1 of the semiconductor substrate 110, and by partially removing the interlayer insulating film 150, the contact hole 150H may be formed. In some implementations, the bottom portion of the contact hole 150H may expose an upper surface of the intermediate layer 220.

Thereafter, by performing the processes described in relation to FIGS. 30 and 31, the image sensor 200 may be completed.

Figure 45:
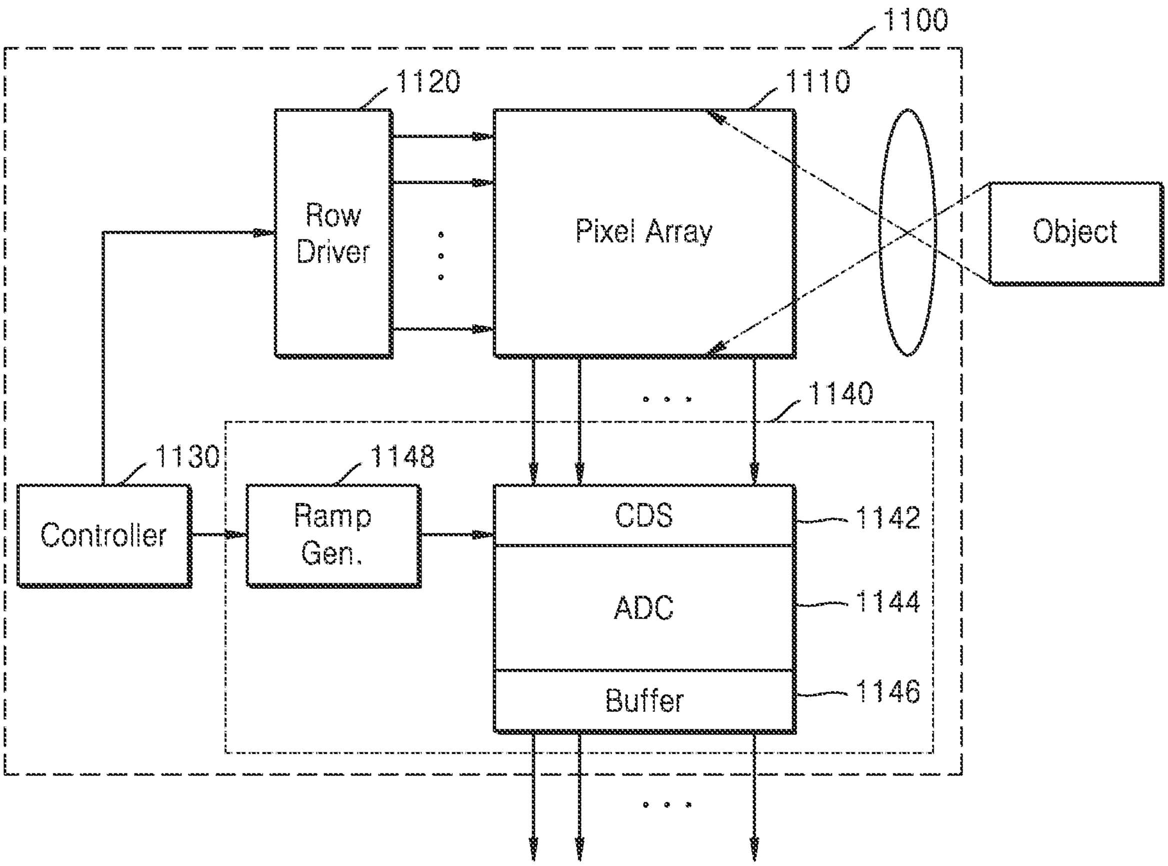
FIG. 45 is a block diagram illustrating an example of components of an image sensor.

FIG. 45 is a block diagram illustrating an example of an image sensor 1100.

Referring to FIG. 45, the image sensor 1100 may include a pixel array 1110, a controller 1130, a row driver 1120, and a pixel signal processor 1140. The image sensor 1100 may include at least one of the image sensors, e.g., image sensors 100, 100A, 100B, 100C, 200, 200A, 200B, and/or 300 of FIGS. 1 to 16.

The pixel array 1110 may include multiple unit pixels disposed in a two-dimensional (2D) manner, and each unit pixel may include an organic photoelectric conversion device. The photoelectric conversion device may absorb light to generate charge, and an electric signal (output voltage) according to the generated charge may be provided to the pixel signal processor 1140 through a vertical signal line. The unit pixels included in the pixel array 1110 may provide one output voltage at a time in a row basis, and accordingly, unit pixels included in one row of the pixel array 1110 may be simultaneously activated by a select signal output by the row driver 1120. Unit pixels included in a selected row may provide an output voltage according to absorbed light to an output line of a corresponding column.

The controller 1130 may control the pixel array 1110 to absorb light to accumulate charge and to temporarily store the accumulated charge, and control the row driver 1120 to output an electric signal according to the stored charge to the outside of the pixel array 1110. Furthermore, the controller 1130 may control the pixel signal processor 1140 to measure an output voltage provided by the pixel array 1110.

The pixel signal processor 1140 may include a correlated double sampler (CDS) 1142, an analog-digital converter (ADC) 1144, and a buffer 1146. The CDS 1142 may sample and hold an output voltage provided by the pixel array 1110. The CDS 1142 may double-sample a particular noise level and a level according to a generated output voltage, and output a level corresponding to a difference between the particular noise level and the level according to a generated output voltage. Furthermore, the CDS 1142 may receive and compare ramp signals generated by a ramp signal generator 1148 and output comparison results.

The ADC 1144 may convert an analog signal corresponding to a level received from the CDS 1142 into a digital signal. The buffer 1146 may latch a digital signal, and the latched signal may be sequentially output to the outside of the image sensor 1100 and transmitted to an image processor (not shown).

While the inventive concept has been particularly shown and described in relation to certain embodiments thereof, it will be understood that various changes in form and details may be made therein without departing from the spirit and scope of the inventive concept as defined by the following claims.

What is claimed is:

1. An image sensor comprising:
a semiconductor substrate comprising a first surface, a second surface, and a photoelectric conversion region;
a buried gate structure disposed in a buried gate trench and extending into the semiconductor substrate from the first surface of the semiconductor substrate;
a floating diffusion region disposed on one side of the buried gate structure in the semiconductor substrate;
a contact pad disposed on the first surface of the semiconductor substrate above the floating diffusion region and comprising polysilicon;
an intermediate layer disposed on the contact pad and comprising a metal silicide;
a contact disposed on the intermediate layer and extending in a vertical direction perpendicular to the first surface of the semiconductor substrate; and
a contact barrier region disposed under the contact pad,
wherein the contact barrier region comprises at least one of carbon and germanium.

2. The image sensor of claim 1, further comprising:
an etch stop layer disposed on the first surface of the semiconductor substrate and covering an upper surface of the buried gate structure,
wherein the etch stop layer surrounds a side wall of the contact pad.

3. The image sensor of claim 2, wherein the contact pad has an upper surface disposed at a higher level than an upper surface of the etch stop layer.

4. The image sensor of claim 2, wherein the contact pad is disposed in a contact recess, and a bottom surface of the contact pad is disposed at a lower level than the first surface of the semiconductor substrate.

5. The image sensor of claim 1, wherein the contact barrier region has an impurity concentration ranging from about 1E19 atom/$cm^3$ to about 5E21 atom/$cm^3$.

6. The image sensor of claim 1, further comprising:

a barrier impurity region disposed in the semiconductor substrate to surround the floating diffusion region, wherein the barrier impurity region comprises at least one of carbon and germanium.

7. The image sensor of claim 6, wherein the barrier impurity region has an impurity concentration of about 1E19 atom/$cm^3$ to about 5E21 atom/$cm^3$, and the barrier impurity region comprises:

a top region disposed on the floating diffusion region; and a bottom region surrounding a bottom portion and a lateral side of the floating diffusion region.

8. The image sensor of claim 7, wherein the top region is disposed at a lower level than the contact barrier region, and the top region is disposed apart from the contact barrier region in the vertical direction.

9. The image sensor of claim 1, further comprising:

a low-doping region disposed between the floating diffusion region and the buried gate structure and around the floating diffusion region in the semiconductor substrate, wherein the floating diffusion region comprises a first type of impurity having a first type of impurity concentration and the low-doping region comprises a first type of impurity having a second type of impurity concentration lower than the first type of impurity concentration.

10. The image sensor of claim 9, wherein the floating diffusion region comprises the first type of impurity, the low-doping region comprises the first type of impurity, and the first type of impurity comprises at least one of phosphorus and arsenic.

11. The image sensor of claim 9, wherein the floating diffusion region comprises the first type of impurity and a second type of impurity, the low-doping region comprises the first type of impurity, the first type of impurity comprises at least one of phosphorus and arsenic, and the second type of impurity comprises at least one of carbon and germanium.

12. The image sensor of claim 1, further comprising:

a pixel separation structure disposed in a pixel trench passing through the semiconductor substrate;

a planar gate structure disposed on the first surface of the semiconductor substrate; and a color filter disposed on the second surface of the semiconductor substrate.

13. An image sensor comprising:

a semiconductor substrate comprising a first surface, a second surface, and a photoelectric conversion region;

a buried gate structure disposed in a buried gate trench and extending into the semiconductor substrate from the first surface of the semiconductor substrate;

a floating diffusion region comprising a first type of impurity and disposed on one side of the buried gate structure in the semiconductor substrate;

a contact pad disposed on the first surface of the semiconductor substrate above the floating diffusion region;

an intermediate layer disposed on the contact pad and comprising a metal silicide;

a contact disposed on the intermediate layer and extending in a vertical direction perpendicular to the first surface of the semiconductor substrate; and a contact barrier region comprising a second type of impurity, different from the first type of impurity, and disposed under the contact pad and between the contact and the floating diffusion region.

14. The image sensor of claim 13, wherein the first type of impurity comprises at least one of phosphorus and arsenic, and the second type of impurity comprises at least one of carbon and germanium.

15. The image sensor of claim 13, wherein a concentration of the second type of impurity in the contact barrier region ranges from about 1E19 atom/$cm^3$ to about 5E21 atom/$cm^3$.

16. The image sensor of claim 13, further comprising:

a barrier impurity region comprising the second type of impurity and disposed in the semiconductor substrate to surround the floating diffusion region, wherein second type of impurity of the barrier impurity region comprises at least one of carbon and germanium.

17. The image sensor of claim 16, wherein the barrier impurity region comprises:

a top region disposed on the floating diffusion region; and a bottom region surrounding a bottom portion and a lateral side of the floating diffusion region.

18. The image sensor of claim 13, further comprising:

a low-doping region comprising a first type of impurity and disposed between the floating diffusion region and the buried gate structure and disposed around the floating diffusion region in the semiconductor substrate, wherein the first type of impurity of the floating diffusion region has a first concentration, and the first type of impurity of the low-doping region has a second concentration lower than that of the first concentration.

19. An image sensor comprising:

a semiconductor substrate comprising a first surface and a second surface, and further comprising a photoelectric conversion region;

a pixel separation structure disposed in a pixel trench passing through the semiconductor substrate to define a plurality of pixels;

a buried gate structure disposed in a buried gate trench extending into the semiconductor substrate from the first surface of the semiconductor substrate;

a floating diffusion region comprising a first type of impurity and disposed on one side of the buried gate structure in the semiconductor substrate;

a low-doping region comprising the first type of impurity and disposed between the floating diffusion region and the buried gate structure and disposed around the floating diffusion region in the semiconductor substrate;

an etch stop layer disposed on the first surface of the semiconductor substrate and covering the buried gate structure;

a contact pad disposed to vertically overlap the floating diffusion region on the first surface of the semiconductor substrate and comprising a side wall surrounded by the etch stop layer;

an intermediate layer disposed on the contact pad and comprising a metal silicide;

a contact disposed on the intermediate layer and extending in a vertical direction perpendicular to the first surface of the semiconductor substrate;

an interlayer insulating film disposed on the etch stop layer and surrounding the contact, and a contact barrier region disposed under the contact pad, wherein the contact barrier region comprises at least one of carbon and germanium.

* * * * *